US010511316B2

United States Patent
Bodnar et al.

(10) Patent No.: US 10,511,316 B2
(45) Date of Patent: Dec. 17, 2019

(54) METHOD OF LINEARIZING THE TRANSFER CHARACTERISTIC BY DYNAMIC ELEMENT MATCHING

(71) Applicant: Analog Devices Global Unlimited Company, Hamilton (BM)

(72) Inventors: Rares Bodnar, Reading (GB); Roberto S. Maurino, Turin (IT); Christopher Peter Hurrell, Cookham (GB); Asif Ahmad, Newbury (GB)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

(21) Appl. No.: 16/053,455

(22) Filed: Aug. 2, 2018

(65) Prior Publication Data

US 2019/0280704 A1 Sep. 12, 2019

Related U.S. Application Data

(63) Continuation-in-part of application No. 15/916,009, filed on Mar. 8, 2018.

(51) Int. Cl.
*H03M 1/66* (2006.01)
*H03M 1/06* (2006.01)

(52) U.S. Cl.
CPC .................. *H03M 1/0612* (2013.01)

(58) Field of Classification Search
CPC ....... H03M 1/0612; H03M 1/66; H03M 1/747
USPC ................. 341/145, 144
See application file for complete search history.

(56) References Cited

U.S. PATENT DOCUMENTS

| 4,499,594 | A | * | 2/1985 | Lewinter | H03M 1/74 |
|||||| 341/126 |
| 4,546,343 | A | | 10/1985 | Higgins et al. | |
| 5,041,831 | A | * | 8/1991 | Bohley | H03M 1/662 |
|||||| 341/120 |
| 5,493,298 | A | | 2/1996 | Bartz | |

(Continued)

FOREIGN PATENT DOCUMENTS

| CN | 105811984 | 7/2016 |
| WO | 2002/023728 | 3/2002 |

(Continued)

OTHER PUBLICATIONS

Ex Parte Quayle Office Action issued in U.S. Appl. No. 16/916,009 dated Dec. 14, 2018.

(Continued)

*Primary Examiner* — Jean B Jeanglaude
(74) *Attorney, Agent, or Firm* — Patent Capital Group

(57) ABSTRACT

A stage, suitable for use in and analog to digital converter or a digital to analog converter, comprises a plurality of slices. The slices can be operated together to form a composite output having reduced thermal noise, while each slice on its own has sufficiently small capacitance to respond quickly to changes in digital codes applied to the slice. This allows a fast conversion to be achieved without loss of noise performance. The slices can be sub-divided to reduce scaling mismatch between the most significant bit and the least significant bit. A shuffling scheme is implemented that allows shuffling to occur between the sub-sections of the slices without needing to implement a massively complex shuffler.

20 Claims, 29 Drawing Sheets

(56) References Cited

U.S. PATENT DOCUMENTS

| | | | |
|---|---|---|---|
| 5,600,322 | A | 2/1997 | Garavan |
| 5,621,409 | A | 4/1997 | Cotter et al. |
| 6,154,160 | A * | 11/2000 | Meyer ................ H03M 1/1014 341/139 |
| 6,172,629 | B1 | 1/2001 | Fetterman |
| 6,404,364 | B1 | 6/2002 | Fetterman et al. |
| 6,507,304 | B1 * | 1/2003 | Lorenz ................ H03M 1/687 341/118 |
| 6,556,158 | B2 | 4/2003 | Steensgaard-Madsen |
| 6,570,521 | B1 | 5/2003 | Schofield |
| 6,657,570 | B1 | 12/2003 | Chiappetta |
| 6,734,818 | B2 | 5/2004 | Galton |
| 6,784,814 | B1 | 8/2004 | Nair et al. |
| 6,828,927 | B1 | 12/2004 | Hurrell et al. |
| 6,970,120 | B1 | 11/2005 | Bjornsen |
| 7,015,853 | B1 | 3/2006 | Wolff et al. |
| 7,148,834 | B2 | 12/2006 | Da Fonte |
| 7,158,070 | B1 | 1/2007 | Yang et al. |
| 7,348,906 | B2 | 3/2008 | O'Donnell et al. |
| 7,602,324 | B1 | 10/2009 | Huang et al. |
| 7,710,300 | B2 | 5/2010 | Kwan |
| 7,944,378 | B1 | 5/2011 | Pesenti |
| 8,213,703 | B2 * | 7/2012 | Inoue ................ G06T 7/001 382/144 |
| 8,451,160 | B1 | 5/2013 | Zhou et al. |
| 8,618,975 | B2 * | 12/2013 | Nys ................ H03M 1/144 341/172 |
| 8,730,073 | B1 | 5/2014 | Wang et al. |
| 8,766,839 | B2 | 7/2014 | Janakiraman et al. |
| 8,907,833 | B1 | 12/2014 | Zhou et al. |
| 9,054,727 | B2 | 6/2015 | Steensgaard-Madsen |
| 9,214,953 | B1 * | 12/2015 | Mengad ................ H03M 3/50 |
| 9,413,381 | B2 * | 8/2016 | Vasani ................ H03M 1/002 |
| 9,735,799 | B1 * | 8/2017 | Nguyen ................ H03M 1/06 |
| 9,748,966 | B2 | 8/2017 | Nagarajan et al. |
| 9,825,643 | B1 * | 11/2017 | Taylor ................ H03M 1/1023 |
| 2006/0022854 | A1 | 2/2006 | Bjornsen |
| 2010/0283641 | A1 | 11/2010 | Huang |
| 2013/0278453 | A1 | 10/2013 | Steensgaard-Madsen |
| 2016/0149587 | A1 | 5/2016 | Mulder |

FOREIGN PATENT DOCUMENTS

| | | |
|---|---|---|
| WO | 2010/048083 | 4/2010 |
| WO | 2010/144205 | 12/2010 |
| WO | 2013/142463 | 9/2013 |

OTHER PUBLICATIONS

Ex Parte Quayle Office Action issued in U.S. Appl. No. 16/052,890 dated Oct. 22, 2018, 9 pages.

Yong Lim et al., *A 1 mW 71.5 dB SNDR 50 MS/s 13 bit Fully Differential Ring Amplifier Based SAR-Assisted Pipeline ADC*, IEEE Journal of Solid-State Circuits, vol. 50, No. 12, Dec. 2015, 11 pages.

*AN-804 Improving A/D Converter Performance Using Dither*, Texas Instruments, Literature No. SNOA232, © 2011, 10 pages.

Brad Brannon, *Overcoming Converter Nonlinearities with Dither*, AN-140 Application Note, Analog Devices, Dec. 1995, 8 pages.

Non-Final Office Action issued in U.S. Appl. No. 16/052,890 dated Mar. 25, 2019, 7 pages.

Ex Parte Quayle Office Action issued in U.S. Appl. No. 15/916,009 dated Dec. 14, 2018.

Partial Search Report issued in PCT/EP2019/055852 dated Jun. 17, 2019, 18 pages.

Verbruggen et al., *A 2.5 mW 11b 410 MS/s Dynamic Pipelined SAR ADC with Background Calibration in 28nm Digital CMOS*, 2013 Symposium on VLSI Circuits Digest of Technical Papers, 2 pages.

Lee et al., *A SAR-Assisted Two-Stage Pipeline ADC*, IEEE Journal of Solid-State Circuits, vol. 46, No. 4, Apr. 2011, 11 pages.

English Translation of Foreign Reference CN105811984, 10 pages.

EP Office Action issued in EP Patent Application Serial No. 19161686.1 dated Aug. 13, 2019, 10 pages.

\* cited by examiner

METHOD OF LINEARIZING THE TRANSFER CHARACTERISTIC BY DYNAMIC ELEMENT MATCHING

PRIORITY DATA

This application claims priority to U.S. application Ser. No. 15/916,009, titled "ANALOG TO DIGITAL CONVERTER STAGE", which is hereby incorporated by reference in its entirety.

TECHNICAL FIELD OF THE DISCLOSURE

The present disclosure relates to apparatus for and methods of improving the transfer characteristic of a device. The techniques disclosed herein can be used to reduce integral non-linearity (INL) errors in analog to digital converters and digital to analog converter. Systems using such devices can also be expected to show improvements due to reduced integral non-linearity.

BACKGROUND

Random variations during fabrication of analog to digital converters (ADCs) and digital to analog converters (DACs) can cause elements within those devices to be effectively overweight or underweight in terms of the contribution they make to a conversion result. This disclosure provides techniques and circuits that can improve linearity in sub-divided architectures and/or in sliced architectures.

BRIEF DESCRIPTION OF SOME OF THE EMBODIMENTS OF THE DISCLOSURE

In a first aspect of the present disclosure, there is provided a residue forming digital to analog converter. Such a converter may be used as a residue forming stage within a pipelined analog to digital converter. The digital to analog converter is responsive to a data word that represents the digital value that is to be converted to an analog value. The digital to analog converter comprises at least two cooperating digital to analog converters arranged in parallel. A data word generator is arranged to receive the data word and to generate data words for each of the cooperating digital to analog converters.

Advantageously conversion elements, such as switched capacitors or current sources, within a given one of the cooperating digital to analog converters can be identified using a first counting scheme, e.g. a first index. Advantageously individual ones of the cooperating digital to analog converters can be identified using a second counting scheme, e.g. a second index.

Preferably the shared portion, which represents a bit pattern provided to each of the cooperating digital to analog converters, is formed by a one-dimensional shuffling operation.

The data word has a first portion which is converted by a data word generator into a first data word part and an additional (or second) data word part. The first data word part represents the first part digital word after a shuffling operation has been applied.

The digital word may be a binary word, a radix <2 word, a unary encoded word, or a mixed unary encoded word where a plurality of bits have a first transfer function encoding each bit value into an analog value and at least one bit has a second transfer function different to the first transfer function.

The digital word also has a second portion. The second portion may, for example, represent bits of a lesser significance than those in the first portion. Some of the bits in the second portion may be represented by an additional portion of the data word, where the additional portion has been shuffled using the other one of the first and second indices.

In an example, the individual cells may be regarded as being placed in a rectangular array having an X axis and a Y axis. The first shuffling operation may shuffle cells along the X axis. The first shaft represents the shared data, so for each X axis shuffle all of the cells in a given column of the Y axis have the same value.

In a further example, building on the preceding example, on column or a small number of columns may be used to convert data from the second portion of the digital word. The second portion does not form part of the shared portion of the data word because it contains data that varies within a column, as opposed to being constant within a column.

References to rows and columns can be swapped without departing from the scope of the invention. Similarly the cells need not be arranged in a rectangular array. Physical arrays of elements arranged in other orders such as arcs or circles of differing radii also form groups where cells can be addressed by two indices.

In an embodiment of this disclosure there is provided a device comprising a plurality of slices, each slice comprising a plurality of elements, the elements being sub-divided into a first group of elements and a second group of elements. The first and second groups of elements are connected together by an intermediate component coupled such that their contribution to an output node is weighted. One of the elements of the first group of elements in each slice is controlled in response to a bit value related to bit values for the second group of elements of at least some of the plurality of slices.

It is thus possible to transfer a portion of the task of forming the output word across the boundary imposed by the intervening component. This can be exploited to increase the effective resolution of the first group of elements on the slices when acting in unison. This can also be exploited in a shuffling scheme to equalize the average least significant bit value between the first and second groups of elements.

According to a second aspect of this disclosure there is provided a digital to analog converter comprising a plurality of DAC slices, each slice being segmented into a main DAC part and a sub-DAC part. The main DAC part is adapted to output an analog value relating to a plurality of most significant bits of a digital word, and the sub-DAC part is adapted to output a value associated with a plurality of bits of lesser significance. Some of the bit values associated with the sub-DAC are shuffled across the main DAC part of the DAC slices. Such shuffling allows gain or scaling errors between the main DAC part and the sub-DAC part to be reduced.

According to a third aspect of this disclosure there is provided a method of improving linearity in a DAC or in an ADC including a DAC, wherein the DAC comprises a plurality of slices, each slice being divided into a main DAC and a sub-DAC, the method comprising shuffling values for a plurality of bits of the main DACs in a shared shuffle pattern across each of the slices, and shuffling values related to some of the bits in the sub-DACs across the main DACs.

BRIEF DESCRIPTION OF THE DRAWINGS

To provide a more complete understanding of the present disclosure and features and advantages thereof, reference is made to the following description, taken in conjunction with the accompanying Figures, wherein like reference numerals represent like parts, in which:

FIG. 8 schematically illustrates an example of a shuffler's output in allocating groups of cells to represent a bit weight B0, B1 and so on;

DESCRIPTION OF SOME EMBODIMENTS OF THE DISCLOSURE

ADCs are widely used. For example they can be found in telecommunications equipment, cameras, audio equipment, games consoles, industrial systems, medical devices, automotive applications, aerospace applications and a whole host of other applications and systems where an analog value, which may represent light intensity, sound, pressure, speed, voltage, current, a radio signal and so on, is converted into a digital quantity that can be processed by a data processor, an embedded digital circuit, a computer or so on.

The speed at which conversions are required from the analog domain to the digital domain, and the number of bits of resolution required, can vary enormously. The transfer function of the ADC should be established, for example linear and monotonic, such that differential non-linearity errors and integral non-linearity errors are small.

Conversion between the digital and analog domains is required and DACs should exhibit good linearity. Generally (but not of necessity) digital to analog converters are controlled in response to a binary input word. Herein, an input word to a DAC is generally referred to as a data word. A binary input word provides for the potential of obtaining a linear response while minimizing the width (i.e. the number of bits) in the input word. Again, in the pursuit of good linearity the differential non-linearity errors and integral non-linearity errors should be small.

However real converters, be they ADCs or DACs, can exhibit a non-linear response. The present disclosure provides a way to linearize the response, at least on a statistical basis, of a device used in transforming signals between the digital and analog domains, be that analog to digital conversion or digital to analog conversion.

There is a desire to provide ADCs with high conversion throughput, for example operating with signal bandwidths of between 10 and 100 MHz, at good resolution, say greater than 14 bits. The present disclosure provides structures for achieving these kind of superior performance levels. However achieving this performance is difficult, and to appreciate how difficult and hence understand the nature of the inventive aspects of this disclosure, it is useful to provide a summary of the structure of a popular converter architecture before looking at some of the fundamental limitations around the physics relating to sampling circuits and digital to analog converters.

A particularly popular variant of ADC uses a switched capacitor array to act both as a sample and hold circuit and as a capacitive charge-sharing DAC which is driven to test a bit trial value against the sampled analog signal value. Often ADCs are provided as differential circuits. The present disclosure will start by considering single ended converters (as they are simpler) but the comments and considerations that will be discussed apply equally to differential ADCs.

Figure 1:
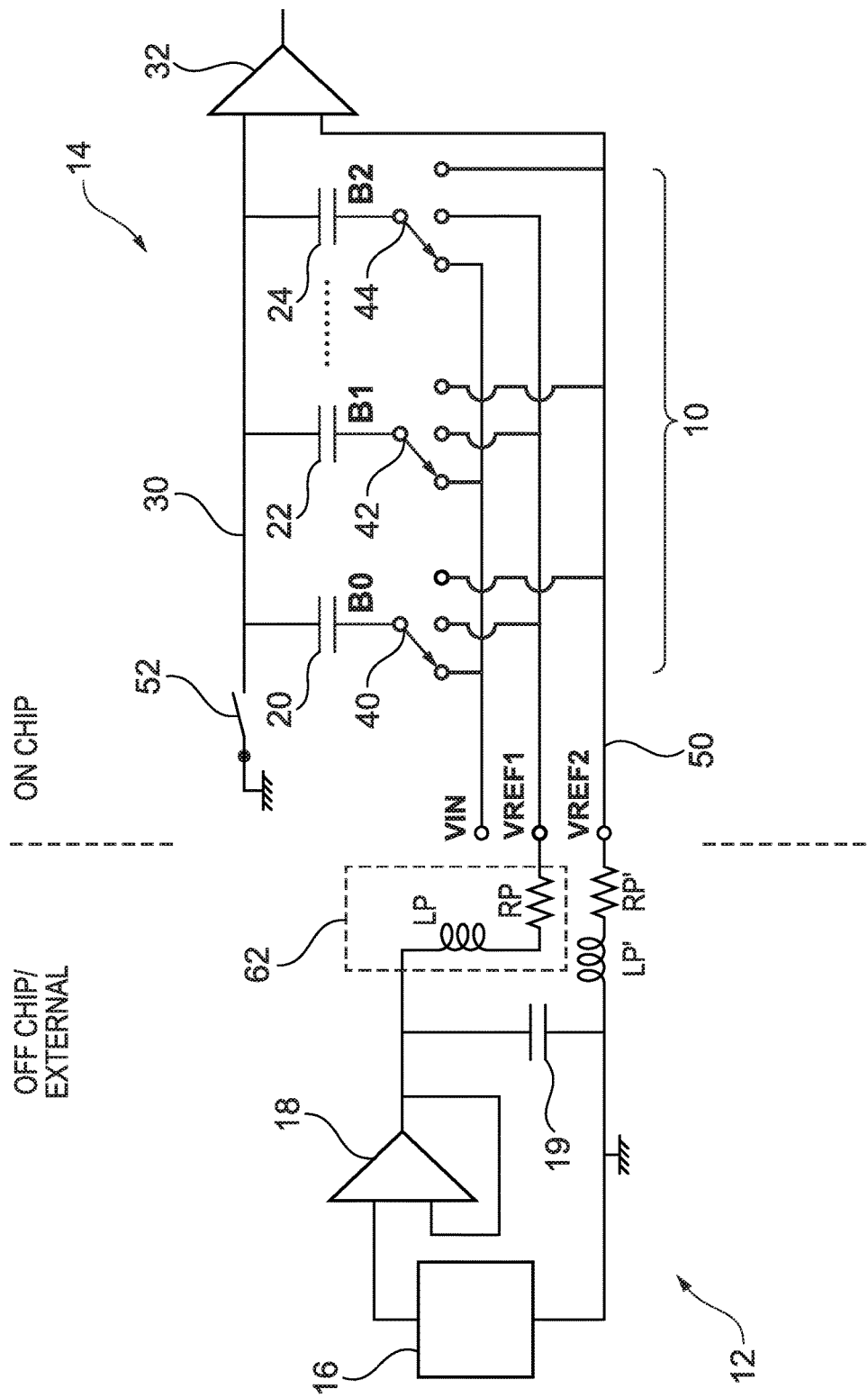
FIG. 1 schematically illustrates an analog to digital converter comprising a sampling capacitor based digital to analog converter.

FIG. 1 schematically shows a prior art arrangement comprising a sampling switched capacitor charge redistribution digital to analog converter, generally indicated 10, which is provided within an integrated circuit implementing an analog to digital converter 14 and which receives a first reference voltage VREF1 from an external reference circuit, generally designated 12. In this context "external" means that the reference circuit 12 (or at least not all of it) is not provided on the same silicon die as the switched capacitor charge redistribution digital to analog converter 10. However all of or some parts of the reference circuit may be co-packaged with the die carrying the analog to digital converter 14 such that from a user's perspective all the components are provided by the same chip scale package or integrated circuit. The reference circuit comprises a reference voltage generator 16 which is often (but not necessarily) buffered by a buffer 18. The output voltage at the output of the buffer 18 can be further stabilized by the provision of a relatively large storage capacitor 19 external to a chip scale package, even though other parts of the circuit such as a buffer or voltage reference source might be provided on the silicon die with the ADC or co-packaged with the ADC. The DAC 10 also receives VREF2, which may be a local 0V, ground or Vss to which all other voltages are referenced.

For completeness a brief description of the operation of charge redistribution digital to analog converters as part of successive-approximation-register ADCs will be presented here. The charge redistribution digital to analog converter comprises a plurality of capacitors, of which in this example three capacitors 20, 22 and 24 are shown. Other capacitors may exist between capacitors 22 and 24. In a converter that does not have redundancy, the capacitors are binary weighted and follow a binary progression. Thus, if only three capacitors existed and capacitor 24 had a notional and arbitrary value of "1C" then the capacitor 22 would have a value of "2C" and a capacitor 20 would have a value of "4C". Each capacitor can be regarded as representing a bit in a binary word, and hence the largest capacitor, in this example capacitor 20, represents the most significant bit, MSB, having a weight of 4, whereas the smallest capacitor 24 represents the least significant bit, LSB, having a weight of 1. Such capacitor arrays as used in ADCs commonly provide between 12 and 16 bits of resolution and this implies a corresponding number of capacitors. In some cases, to avoid scaling problems between the MSB and the LSB, the capacitor array can be divided or segmented one or more times. This effectively allows a rescaling between capacitors in each segment of the array and avoids the need for the largest capacitor of the DAC to be, for example $2^{15}$ times the size of the smallest capacitor for a 16 bit converter. Although not shown, the switched capacitor array or a segment thereof is typically terminated by an additional terminating capacitor having a value equal to the least significant capacitor within that array. For completeness a divided array will be discussed later with respect to FIG. 2.

Continuing with FIG. 1, it is possible to vary the 'weights' (that is the relative capacitance of the capacitors) or numbers of capacitors within the array in order to provide some redundancy, i.e., the ability to recover from an incorrect bit decision during the conversion process. This can allow the designer to reduce the settling time between each bit trial to achieve a faster conversion rate. Redundancy can, for example, be achieved by occasionally inserting at least one additional capacitor within the array which repeats a weight, thus the capacitors are still binary weighted but do not follow a binary sequence of weights. A further approach to providing redundancy is to change the "radix" of the capacitors in the array from 2 (which represents binary weighting) to a smaller number such as 1.8. Thus the ratio of one capacitor to its neighbor becomes 1.8 rather than 2. This inserts redundancy into the array such that an incorrect bit decision can be corrected as the conversion process proceeds. In either case, redundancy is implemented so as to allow errors of either sign (i.e., the error has made the result underweight or overweight) to be corrected as the conversion proceeds.

As shown in FIG. 1 each of the capacitors 20, 22, 24 has a first plate, which will also be referred to as a "top plate" which is connected to a conductor 30 which itself is connected to a first input of a comparator 32. Each capacitor also has a second plate, also referred to as a "bottom plate", which is connected to an electronic switch. The first capacitor 20 representing the MSB, which will be referred to as B0, is connected to a first switch 40, the second capacitor 22 representing the next most significant bit B1, is connected to a second switch 42 and the third capacitor 24, corresponding to bit B2, is connected to a third switch 44. The switches are schematically shown as three position switches although in reality they may be implemented as three field effect transistors per switch which are controlled by a switch controller (not shown) to implement a three position break before make switch function. The switch 40 can be regarded as being operable in a first position or first mode to connect the bottom plate of the capacitor 20 to a signal input VIN. In a second position or second mode it is operable to connect the bottom plate of the capacitor 20 to VREF1, and in a third position or third mode it connects the bottom plate of the capacitor 20 to a second input VREF2, which often corresponds to a local ground or a "negative" power rail. The second and third switches 42 and 44 are similarly configured, and the second input of the comparator is, in this example, also connected to the local ground via a conductor 50. As noted before, only three capacitors and their associated switches have been illustrated for simplicity, but more capacitors and switches can be provided within an ADC.

In a sample or track phase of operation of the analog to digital converter described in this example, the switches 40, 42 and 44 are connected to VIN while a further switch 52 is closed so as to connect the conductor 30, and hence the top plates of the capacitors, to ground or to some other appropriate reference or bias voltage. This enables the capacitors 20, 22 and 24 to become charged with the voltage VIN (or to VIN−Vbias if switch 52 connects to a bias voltage, such as (VREF1−VREF2)/2). The analog to digital converter then moves to a convert phase in which switch 52 is opened so as to allow the voltage on the conductor 30 to float, and the switches 40, 42 and 44 are initially connected to VREF2. The bit trial sequence can then begin. Initially the first bit, B0, i.e. the most significant bit is trialed by connecting the bottom plate of the capacitor 20 to VREF1. This causes charge redistribution between the capacitors to occur as they form a potential divider. As a result the voltage at a first input to the comparator changes and after a settling time has elapsed, the comparator 32 is strobed (i.e. its output is examined) in order to determine whether the voltage at the first input is greater or less than the voltage at the second input. If the voltage of VIN was sufficiently great such that it exceeds the value equivalent to $$\frac{VREF1}{2},$$

then the voltage at the first input of the comparator exceeds that at the second input of the comparator and the most significant bit is kept and capacitor 20 remains connected to VREF1, otherwise the bit is discarded and switch 40 is operated to connect the bottom plate of the MSB capacitor 20 back to VREF2. The process proceeds to the next bit trial, i.e. to test the second bit B1 where the lower plate of capacitor 22 is connected to VREF1 (the state of switch 40 remaining unchanged from whichever position it was left in after the end of the first bit trial) and after a settling time the output of the comparator 32 is examined to see whether the switch 42 should be left as it is, or reset back to connecting the lower plate of the capacitor 22 to VREF2. Switch 42 is then either reset or left alone as a result of that comparison, and the trial moves on to the next capacitor 24, representing the third bit B2, and switch 44 is changed from VREF2 to VREF1. Again after a settling time the output of the comparator is examined to see whether switch 44 should be left in its present position or be reset. At the end of the trial sequence the positions of the switches 40, 42 and 44 can be examined and these represent the converted result.

The sequence can obviously be extended to include more than three capacitors. Similarly the sequence can be extended to include switched capacitor arrays having redundancy, whether this is by the inclusion of additional redundant capacitors or by using a radix less than 2, but then the switch sequence needs to be examined and further converted into a binary word. Although the ADC has been described as a single ended device, the above description can be extended to differential converters. Furthermore the terminology "bit trial" stems from the early days of SAR (successive-approximation-register) converters where only one bit could be determined during each bit trial. More modern designs enable multiple bits to be determined during a bit trial, and the term "bit trial" as used herein includes determining more than one bit in a given bit trial period.

Figure 2:
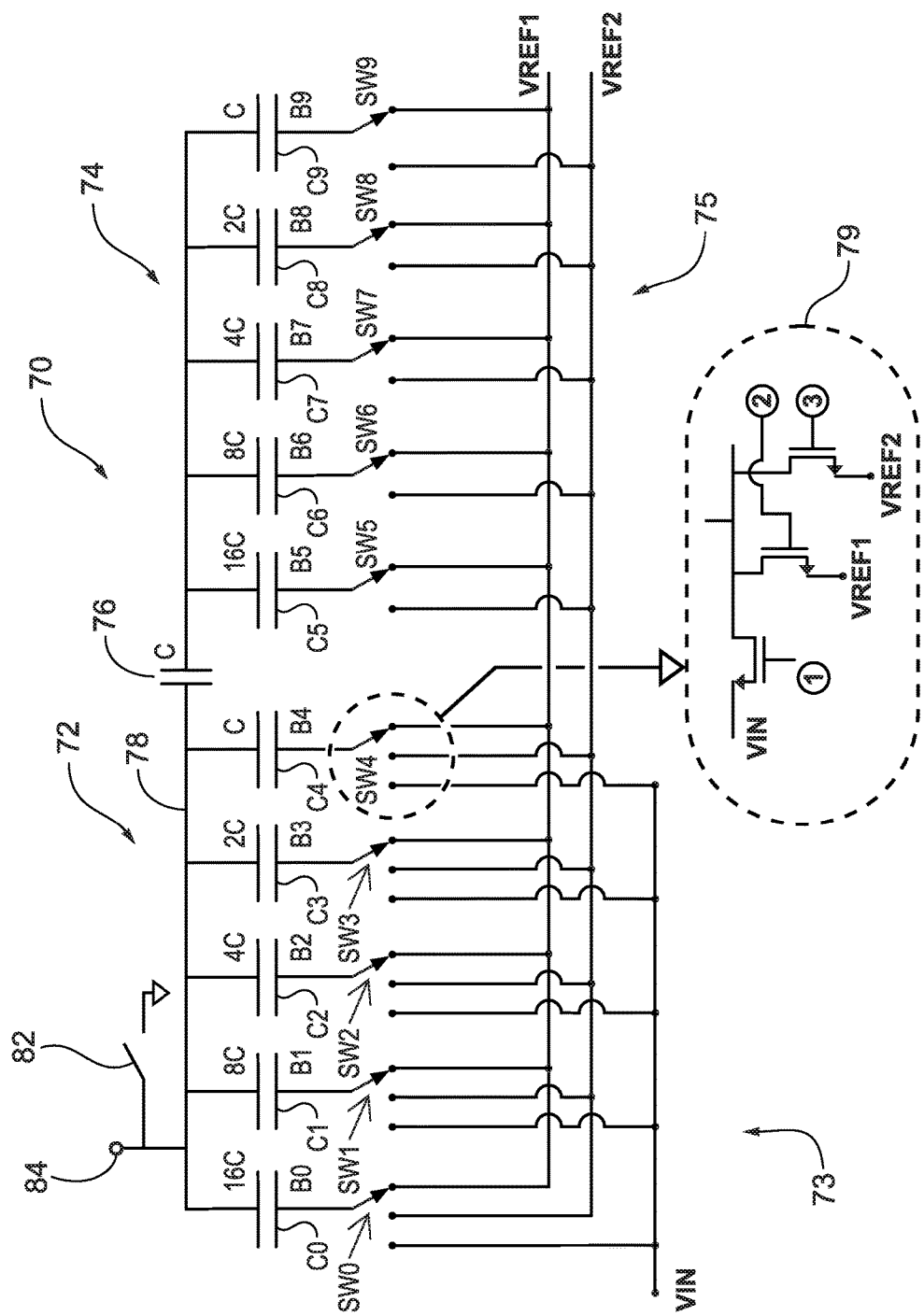
FIG. 2 is a circuit diagram of a 10 bit sampling DAC.

As noted above, the DAC can be implemented as a sub-divided capacitor array, for example as shown in FIG. 2. The sub-divided capacitor array, generally designated 70, comprises a first capacitor array 72 and a second capacitor array 74. The first capacitor array 72 comprises capacitors C0 to C4 configured to form a sampling capacitor DAC 73, like that discussed with respect to FIG. 1, and representing bits B0 to B4. The top plates of C0 to C4, having values 16C, 8C, 4C, 2C and C respectively, are connected to a shared conductor 78 which connects to a node 84, to which a comparator may be connected and/or to which a residue amplifier may be connected. The purpose of a residue amplifier will be discussed later. The capacitors C0 to C4 have respective three position switches S0 to S4 such that the capacitors C0 to C4 can be connected to sample an input voltage VIN (with switch 82 acting as a sampling switch), to Ref1 or to Ref2. Capacitors C0 to C4 may be nominally binary weighted to represent, for example, the five most significant bits of a 10 bit converter. One or more of the capacitors may be provided as a repeated weight, thereby reducing the number of bits from five to four or three, but allowing the converter to include redundancy such that it can recover form an incorrect bit trial decision. For completeness the three individual FETs (Field-Effect-Transistors) forming switch S4 are shown in greater detail in the blown up region 79. Each transistor is driven with a respective switch control signal from a SAR switch controller (not shown). SAR switch controllers can be implemented as state machines. While all the capacitors C0 to C4 in the first capacitor array (or sub-array) 72 have been shown as being arranged to be able to sample the input signal VIN, this is not a necessity. Some of the capacitors in the first array may not be engaged in sampling VIN.

The second capacitor array 74 comprises capacitors C5 to C9 having weights 16C, 8C, 4C, 2C and C respectively and acts as a sub-DAC 75. The sub-DAC 75 is connected to the sampling capacitor DAC 73 by way of a coupling capacitor 76. The capacitors C5 to C9 can form the five least significant bits of the DAC. The sub-DAC is, in this example, not a sampling DAC as the capacitors therein have no connections to VIN. The sub-DAC could be arranged to sample the input signal if desired.

The segmentation breaks the scaling between the capacitors and reduces the space required to implement the DAC. For example, in a 10 capacitor array without segmentation and without redundancy, the capacitor weights would follow the pattern C9=1, C8=2, C7=4, C6=8, C5=16, C4=32 and so on up to C0=512. Thus the total area required by the capacitors of such an array would be 1023 times the area of the unit capacitor. If the array was sub-divided into 2 arrays each containing 5 capacitors, the arrays being coupled by a coupling capacitor 76 of unit size, then we can see that C9=1, C8=2, . . . C5=16, C4=1, C3=2 and so on up to C0=16, and hence the capacitors of the array occupy an area of 63 times the area of the unit capacitor. This is a significant saving of space, and hence of cost. It also improves the scaling between capacitor C9 representing the smallest bit B9 and the capacitor C0 representing the largest bit B0.

In any switched capacitor array, be that sub-divided or non-sub-divided, the bit trials take time. Looking at FIG. 1 again, it is evident that switching any of the switches 40, 42 and 44 results in circulating current flows. Thus, if switch 40 is switched from VREF2 to VREF1 such that the bottom plate of capacitor 20 becomes increased in voltage, then a transient circulating current flow exists from capacitor 20 through capacitors 22 and 24 and their associated switches to VREF2. The current then flows through the storage capacitor 19 of the reference circuit 12 and back through the terminal VREF1 and switch 40 to the bottom plate of the first capacitor 20.

This current also flows along the bond wires of the integrated circuit between its external pins and the nodes VREF1 and VREF2 and also along conductor tracks within a printed circuit board to the voltage reference, or along bond wires in the co-packaged device. The tracks and the bond wires each exhibit a parasitic inductance and a parasitic resistance. These unwanted impedances are designated by inductor LP and resistor RP enclosed within a chain line 62 in FIG. 1 and also by similar parasitic components LP' and RP' in the path from the switched capacitor array to ground. Furthermore, the storage capacitor 19 will also exhibit an inductance and a resistance, and these parasitic components can also be represented within the values of LP and RP. Similarly the switches 40, 42 and 44 also exhibit a resistance which again can be represented within the value of RP.

The reference circuit comprises a reference voltage generator 16, which is a precision voltage reference of any suitable implementing technology, which optionally provides an output to an input of a buffer 18. The buffer 18 protects the reference voltage generator 16 from having to supply current to the switched capacitor digital to analog converter 10 within the analog to digital converter. By its very nature, the buffer 18 consumes power even when the analog to digital converter is inactive, for example because the ADC has completed one conversion and is waiting until another one is scheduled.

At each operation of the switches 40, 42 and 44 the circulating current flows through the various capacitors, the parasitic inductor, and the parasitic resistor. The combination of the capacitors and inductors has the potential to form an LC (Inductor-Capacitor) circuit which may ring. In order to avoid this the circuit should be at least critically damped, or be close to critically damped. The resistance Rcritical of RP (see FIG. 1) for critical damping is RP=$(4L/C)^K$. The time constant Tcritical, for a circuit at critical damping is $(4LC)^{1/2}$. The settling time of the switched capacitor array, as determined by Tcritical, is limited by parasitic inductance LP and the capacitance C of the sampling DAC.

Some ADCs made by Analog Devices Inc. may bring a copy of the reference voltage "on-chip" and avoid any circulating current through LP. Thus the reference voltage is brought within the same integrated circuit as the switched capacitor charge redistribution digital to analog converter within the ADC, thereby reducing the value of L. Such techniques can be used with the embodiments of this disclosure.

Returning to considering the performance of the sampling stage, the transistors of the switches S0 to S4 may offer a combined fixed impedance of RO when switched on. R is typically in the order of a few ohms to hundreds of ohms. Assuming a fixed value fixed value of R, it is worthwhile considering the value of C which should be selected. The following passages discusses the trade-off between sampling speed and noise, and how small component variations in the sampling circuit can introduce errors equivalent to several LSB of an analog to digital converter.

When sampling an input signal, the voltage sampled onto the sampling capacitor(s) asymptotes towards VIN. If starting from a fully discharged capacitor, then the sampled voltage Vs can be expressed as:

$$Vs = VIN \exp(-t/RC) \qquad \text{Equation 1}$$

is time, C is the value of the sampling capacitor and R is the resistance of the switches connected in the current flow path.

When resolution is expressed as a percentage of full scale value, it can be seen that:

| | |
|---|---|
| 8 bits = | 0.390625% |
| 10 bits = | 0.097656% |
| 12 bits = | 0.024414% |
| 14 bits = | 0.006104% |
| 16 bits = | 0.001526% |
| 18 bits = | 0.000381% |
| 20 bits = | 0.000095% |

Thus waiting for 10 RC time constants is not sufficient to realize 14 bit resolution, since the sampled voltage would be more that 1 LSB in error.

Typically, for a 16 bit converter the sample circuit samples for at least 12 time constants; for 18 bit conversion the sampling circuit samples for at least 14 time constants, and for 20 bit conversion the sampling circuit samples for 15 time constants.

The performance of the transistor switches in terms of the on state resistance $R_{ON}$ is limited by the fabrication process. It is possible to put transistors in parallel or make a wider transistor to reduce $R_{ON}$, but this comes at a cost of increased charge injection from the gate of the transistor to the sampling capacitor, which can be viewed as a feature of the gate to channel parasitic capacitance of the transistor. Consequently making the transistor switches wider to reduce $R_{ON}$ compared to the value of the capacitor connected to the switch is not an automatic win as the charge injection problem worsens and degrades the accuracy of the analog to digital converter. However, as will be seen later embodiments of this disclosure allow the on resistance to be increased, and deliberately so, while still maintaining good speed and noise performance.

Another way to make the time constant smaller is to make the sampling capacitor smaller. This, however, hits another fundamental problem in the form of Thermal (Johnson-Nyquist) noise. The root mean square thermal noise $N_{RMS}$ on a capacitor can be expressed as $$N_{RMS} = \sqrt{K_B \frac{T}{C}} \qquad \text{Equation 2}$$

$K_B$ is Boltzmann's constant. T is Temperature in Kelvin. C is capacitance in Farads.

This noise is not caused by the capacitor as such, but rather by the thermodynamic fluctuations of the amount of charge on the capacitor due to the switch resistance. Once the capacitor is disconnected from a conducting circuit this random fluctuation is captured by the capacitor.

The RMS (root-mean-square) thermal noise, $N_{RMS}$, on a capacitor at 300K is set out below for a range of capacitor sizes.

| Capacitance | Noise Voltage |
|---|---|
| 1 nF | 2 μV |
| 100 pF | 6.4 μV |
| 10 pF | 20 μV |
| 1 pF | 640 μV |
| 100 fF | 200 μV |
| 10 fF | 640 μV |
| 1 fF | 2 mV |

The minimum capacitor size that can be tolerated within a sampling circuit can be calculated as a function of input resolution or effective number of bits, ENOB. For an ADC, the signal to noise ratio can be represented as:

$$SNR = 20 \log \left( \frac{\frac{Vinpp}{2\sqrt{2}}}{N_{RMS}} \right) \qquad \text{Equation 3}$$

Vinpp represents the peak to peak value of the input signal.

Since the maximum (peak) input value can be equated to VREF, there is also a quantization noise contribution. The uncertainty in an ADC is ±1/2LSB. If this is error is assumed to be triangular across the analog input signal, then the effective number of bits, ENOB, becomes:

$$ENOB = \frac{SNR - 1.76}{6.02} \qquad \text{Equation 4}$$

Suppose an ADC is to sample an input with a full scale range of 5V with 18 bit resolution. The LSB value is $5 \div 2^{18} = 19$ μV. However by the time the quantization noise is taken into account the sampling noise needs to be further reduced to around 11 $\mu V_{RMS}$. This indicates an input capacitance of around 40 pF if the noise is to be less than 1 LSB. If the full scale dynamic range is reduced then the LSB size is correspondingly reduced and the input capacitance has to be increased to obtain the same noise performance expressed in terms of bits.

The speed of the sampling stage is not the only factor that needs to be taken into consideration as the samples cannot be taken back-to-back as the ADC needs some time to make its conversion.

As noted before, the process of trialing the bits by switching the capacitors between the reference voltages causes charge redistribution inside the DAC, the charge flows through the transistor switches and hence is subject to an RC time constant. Also the switching of the capacitors to and from the reference voltage causes abrupt charge draws from the reference voltage, which interact with the inductance of the conductors/tracks between the reference voltage and the capacitors, and with the capacitance of the capacitors themselves to introduce ringing.

Both the ringing and the capacitor to capacitor charge redistribution limit the conversion rate. The ringing needs to be given time to subside below an appropriate value, such as 1 LSB (or the amount of error that redundancy within the ADC can reasonably be expected to correct), and the charge redistribution also needs to be asymptote to an appropriate value. Luckily it turns out that the converter may not need to wait 14 to 16 time constants after setting the bits in a bit trial before strobing the comparator to look at the result of the bit trial. In practice, it is reasonable to wait for a much shorter time, say around 4 time constants in a converter having redundancy. It can be seen that this could add a further (18+3)4=84 time constants to the conversion time for an 18 bit converter having 3 redundant bits. On a simplistic estimate, with an $R_{ON}$ of 10 ohm and a capacitance of 40 pF, and where the sampling capacitor was also involved in the bit trials of a successive approximation converter, and the settling time on average of 14 time constants is allowed for each sampling of the input signal, this would suggest a conversion rate of around: $1/(10 \times 40 \times 10^{-12} \times (14+84))=25$ MHz.

Figure 3:
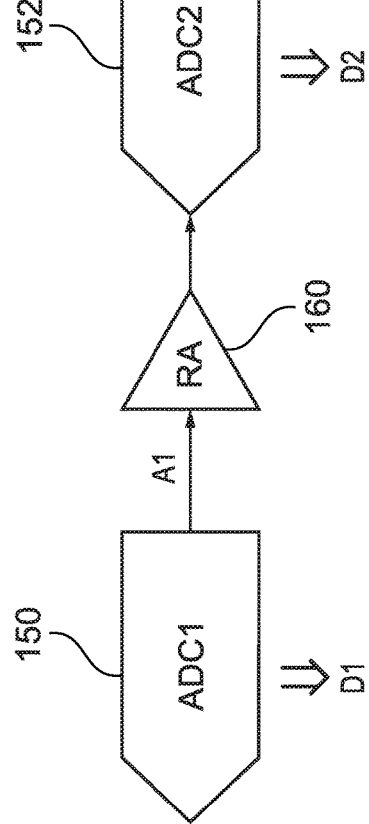
FIG. 3 is a circuit diagram of a two stage pipelined analog to digital converter.

Pipelining allows the bit trials to be split between different stages of an ADC. While the conversion time between taking a sample and outputting a result is not improved by pipelining, the throughput or conversion rate is nearly doubled in a two stage pipeline. The other benefit of pipelining is the amplification of the signal, thus the comparators can make faster decisions. FIG. 3 shows a two stage pipelined ADC. A first stage 150 samples the input signal and converts it to a first digital value D1 representing, say, the most significant 5 to 10 bits. It also forms an analog residue, A1, representing a difference between the analog equivalent of D1 and the actual input signal that was sampled. The analog residue may be amplified by a residue amplifier (RA), 160, and the gained-up residue provided to a second ADC 152 which converts the residue to arrive at a result D2 representing the least significant part of the output word formed by concentrating D1 and D2.

Pipelining also allows different stages of the pipeline to be formed with different resolutions and/or of different analog to digital converter technologies.

Figure 4:
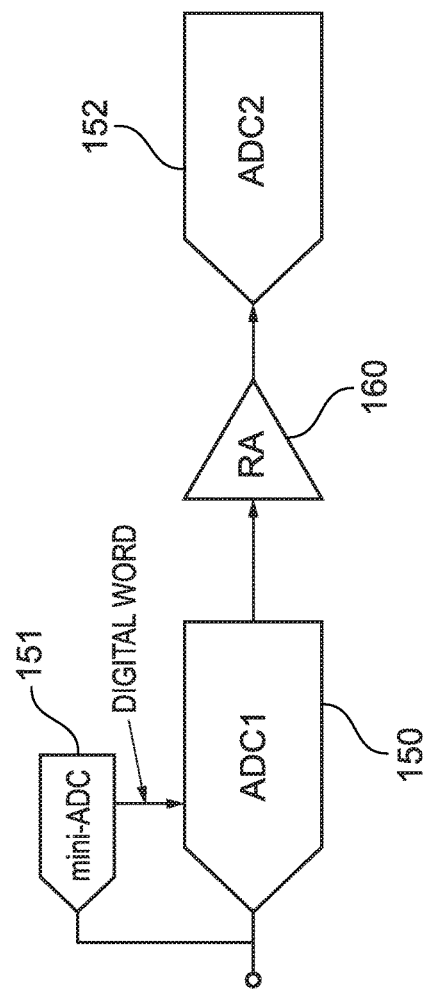
FIG. 4 is a circuit diagram of a modified pipeline converter where the first stage includes a mini DAC.

The speed of conversion, and hence throughput, can be increased by performing some of the bit trials rapidly, for example, by performing the first two, three, or four trials using a Flash ADC and the remaining bit trials using a successive approximation search (or some other ADC strategy). Such an arrangement is shown in FIG. 4 where a mini ADC 151, such as a Flash ADC, can perform two or three of the bit trials rapidly and with less accuracy and pass the result to the first ADC 150 as a starting point for its bit trials. Any errors, such as incorrect decisions can be recovered from since the error will be encoded into the residue and is removed by the second ADC 152. Thus noise performance of the mini DAC is less critical, and hence it can be made to work faster.

Despite all these approaches, there is still a desire to work at even higher sampling rates without incurring noise penalties. The problem is, as noted before, that none of the solutions are easy. Smaller sampling capacitors reduce the RC time constant and hence allow higher throughput, but at the expense of increased thermal noise.

There is also, despite all the work done to minimize mismatch by way of segmenting the DAC into sub-arrays, a residual issue from capacitor size mismatch. Mismatch occurs in other DAC technologies too, so the discussions herein are applicable to other DAC types. For an exemplary 8 bit digital to analog converter, each of its bits is associated with a binary weight. In this example, the bits are designated B0 to B7 with B0 being the most significant bit and B7 being the least significant bit.

The bits are associated with respective control circuits, such as switches to select capacitors to participate in charge-sharing in a switched capacitor array or current sources in a current DAC to participate in a controlled way to forming an output value. However, if the components are not scaled correctly then this can give rise to a repeating error pattern in the response of the DAC, or any device including the DAC, such as an ADC.

Figure 5:
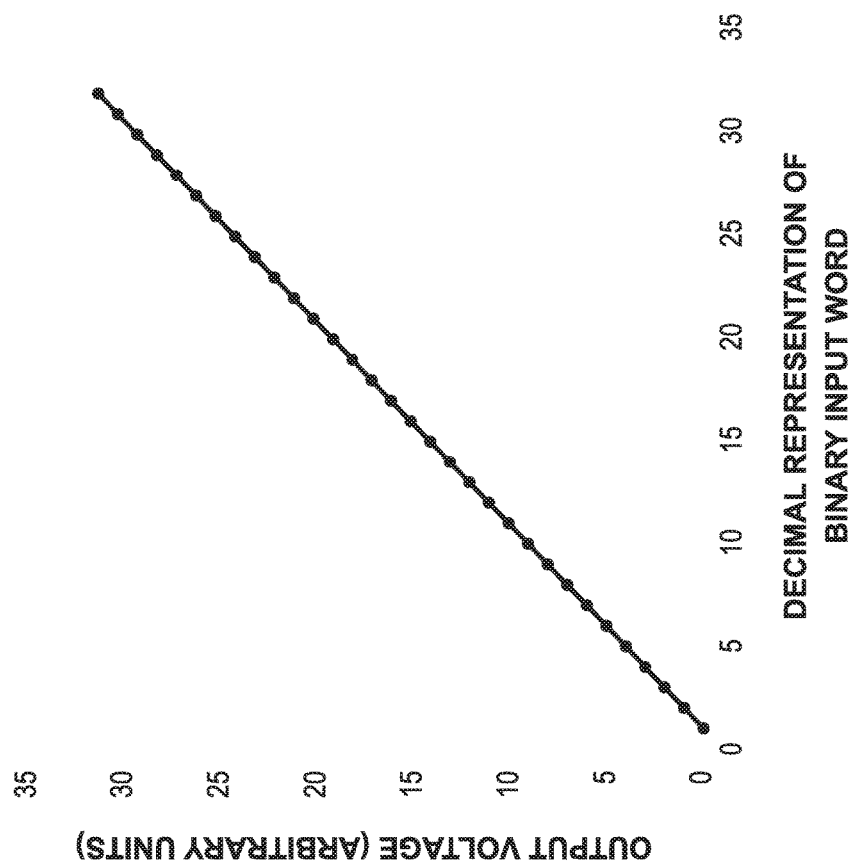
FIG. 5 is a plot of output voltage versus digital word input to an ideal DAC, such as a switched capacitor DAC.

Suppose the exemplary 8 bit DAC is driven with codes 0000 0000 to 0001 1111 and the results are plotted where the bit weights are 128, 64, 32, 16, 8, 4, 2 and 1, respectively. In the ideal case, the output of the DAC and the input code has a linear relationship, as shown in FIG. 5.

The bit weights are formed by scaling the capacitors such that they have the desired ratio of sizes. The scaling can be achieved by connecting "unit" squares together. If individual unit squares are connected by conductive tracks, then the capacitance of the tracks can affect the formation of the capacitance ratio. If the unit squares are formed contiguously then the change in the length of the periphery of the capacitor to the value of the capacitor can result in capacitance variations due to the contribution of fringing fields at the edges of the plates. Furthermore, thermal expansion, external force, changes in dielectric thickness for example by variations in process, the voltage across the capacitors affecting the dielectric or through temperature are other effects that may affect capacitors differently within a single integrated circuit.

Figure 6:
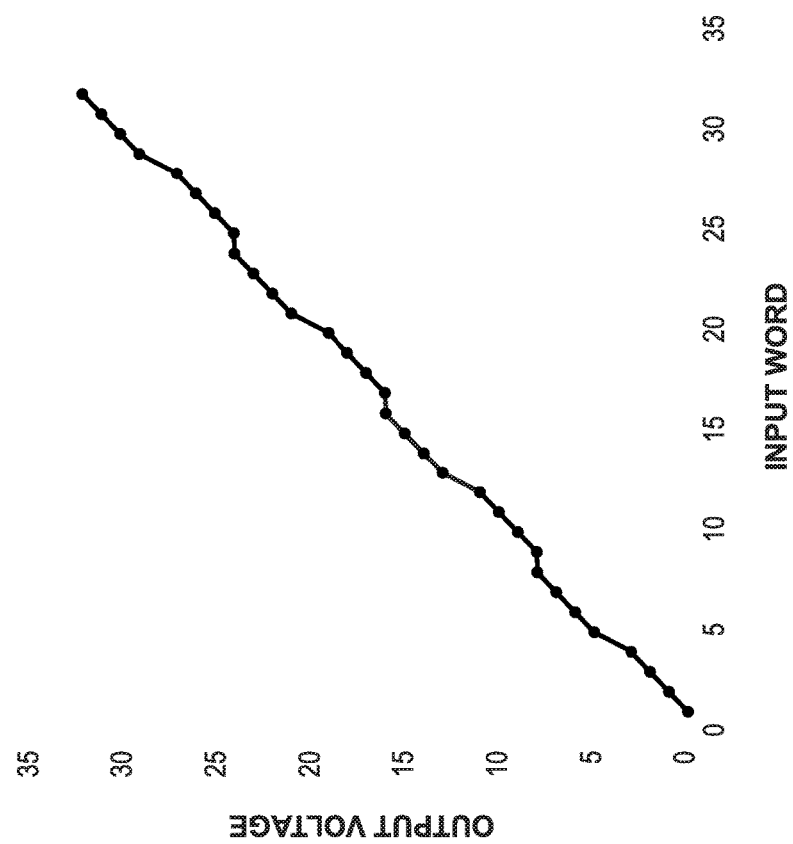
FIG. 6 is a plot of output voltage versus digital input word for a DAC having a bit weight error to show how this can introduce a repeating systematic error into the output voltage from the DAC.

Suppose, just by way of illustration, that a gross error occurred with the capacitor associated with bit 5, i.e. the capacitor having an ideal weight of 4C, and as a result had a weight of 5C. The result would be a systematic variation in the transfer characteristic as shown in FIG. 6.

Errors of this size are not observed in well-constructed DACs or ADCs and this magnitude of error was selected merely to demonstrate the problem. Generally systematic errors of the type shown in FIG. 6 are generally in the region of several parts per million.

Nevertheless, the demands for users of DACs and ADCs are for increasing linearity, as well as speed.

Before moving on further, it is worthwhile pointing out for completeness that modern high performance DACs and ADCs using switched capacitor arrays segment individual capacitors of the array. This approach significantly reduces scaling errors by allowing "shuffling" to be used to reduce mismatch error on a statistical basis.

The scaling between the capacitors associated by B0 to B4 in the example shown in FIG. 2 can be improved by making each of the capacitors from an appropriate number of unit cells, and then randomizing the association between the individual unit cells and a bit weight. The randomization can be done every time a word change occurs at the DAC.

Looking at FIG. 2, bit B4 is associated with a capacitance which has a weight of "C", B3 is associated within a capacitance which has a weight of 2C, B2 has a weight of 4C, B1 a weight of 8C and B0 a weight of 16C. Thus in total the bits B0 to B4 require a capacitance of 16+8+4+2+1=31C.

Figure 7:
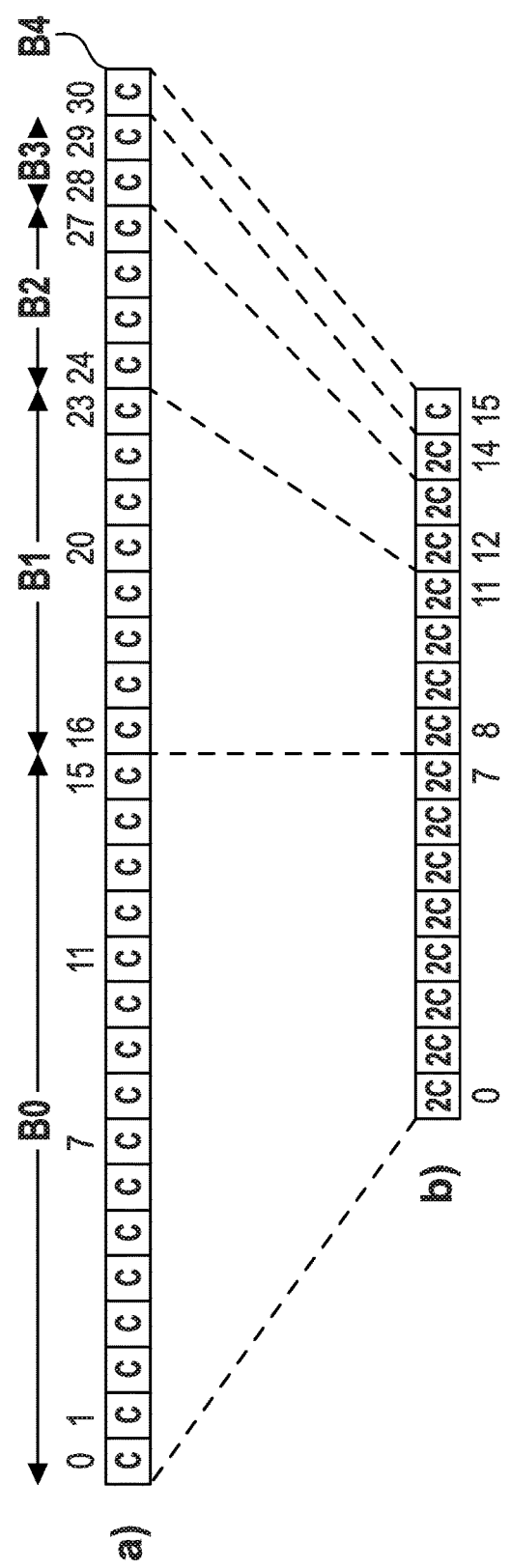
FIG. 7 shows how individual unit cells can be used to form composite capacitors for B0, B1 and so on, and a modified scheme.

Thus, as shown in FIG. 7, part a) the equivalent circuit could be implemented as 31 cells, labelled 0 to 30. Each cell is identical to cell B4 of FIG. 2.

In FIG. 7, part a), B0 is depicted as spanning a contiguous block of cells 0 to 15. B1 spans a contiguous block of cells 16 to 23, and so on. If a constant mapping between bits and the cells that represent them, then segmenting the array in this manner does not bring any advantage.

However, if the grouping is not fixed, and is made dynamically (on the fly) and is not correlated with the input word then the effect of any weight error in a cell is statistically averaged out in operation of the ADC and weight errors can be made to look more like random noise, or at least be made less significant.

Figure 8:
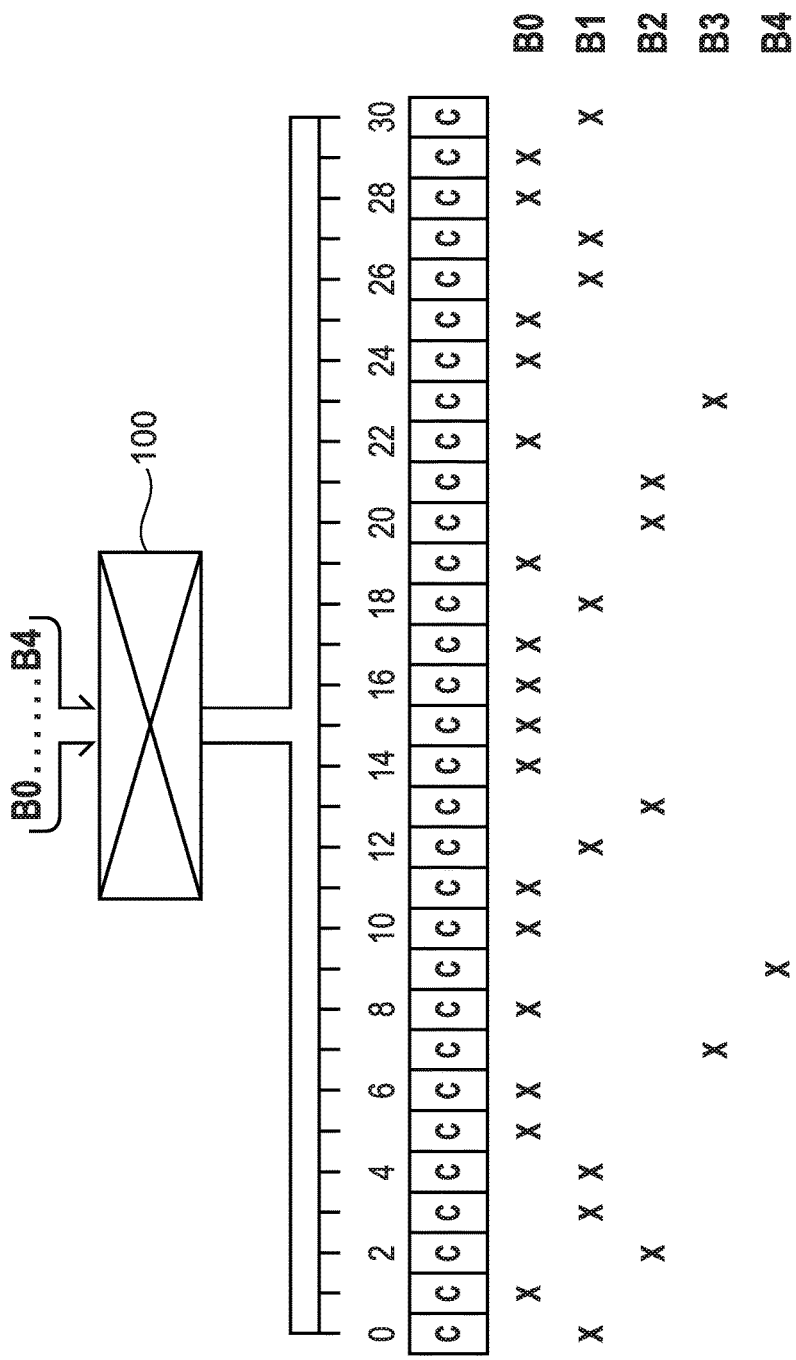

FIG. 8 shows an example allocation of unit cells to bits as a result of a shuffler which advantageously allocates cells to bits pseudo-randomly, while respecting the relative bit weights.

B0 can have a weight of 16c. Thus 16 of the cells can be randomly assigned to be responsive to the bit signal for B0.

Here cells 1, 5, 6, 8, 10, 11, 14, 15, 16, 17, 19, 22, 24, 25, 28 and 29 are associated with B0.

Cells 0, 3, 4, 12, 18, 26, 27 and 30 are associated with B1, while B2 is formed by cells 2, 13, 20, 21; B3 is formed by cells 7 and 23; and cell 9 is allocated to B4. The switches for the cells are set to VREF1 and VREF2 (seen in region 79 of FIG. 2) depending on the state of the bit data word. When a new input word is to be converted, the shuffler randomly (or pseudo-randomly) reallocates the relationship between the cells and the bits, save for the fact that 16 cells are allocated to B0 still, 8 to B1 still, 4 to B2, 2 to B3 and 1 to B4.

Returning to FIG. 7, the inventors realized that a simplification could be made to reduce the number of control lines and switch drivers. The arrangement shown in FIG. 7, part a), can be modified to reduce the number of cells, and hence the number of switches, switch drivers/level shifters (to make sure the transistor switches are low impedance) by making the most (but not all) of the cells (e.g., all bar one) double size, i.e., to have a value 2C, as shown in FIG. 7, part b). It follows that additional unit cells of C could be provided for further randomization, either in addition to the existing cells or in place of some of the "2C" cells.

Having converted the binary weighted stage into a segmented array of equal weight capacitors or mainly equal weight (e.g., most=2C, and one, two, or a few=1C), shuffling can be used to make the weights of each capacitor appear, on average, to be equal.

Despite all of these techniques that can be utilized to improve speed and linearity, the inventors realized that an architectural change could be made to partially decouple the problems of noise from speed, as improving noise performance suggests the use of more capacitance whereas improving speed performance suggests the use of smaller capacitance. They also noted that linearity could be improved. The inventors noted that these problems could be mitigated by use of multiple DACs, for example formed of switched capacitors arrays operating in cooperation as "slices" within a single ADC block—which could be an instance of one converter within a segmented converter or be a converter in its own right. Furthermore shuffling schemes could be improved so as to span over a plurality of slices.

Thus an ADC may be split into a plurality of channels or slices. The slices can be made with relatively small values of capacitance such that a slice can be used to perform an ADC conversion and arrive at an interim result relatively quickly but with a noise penalty. The interim result can be used by one or more other slices to form a residue. The one or more other slices may have bigger values of C, or work in parallel to synthesize a bigger value of C such that the residue has an improved thermal noise figure.

Operating a plurality of sampling stages in parallel is not as simple as merely connecting a load of stages together. That, as with many things in high speed ADCs overlooks some of the fundamental physics that makes this task so challenging.

The stages should be "matched" to set their RC time constant to within an acceptable value. The limit of what constitutes "acceptable" depends on a time budget for sampling the input signal and also for allowing charge redistribution and ringing to settle to around 1 LSB of the channel or slice. Previous discussions about the problem of RC time constant mismatch in the context of a DC signal was a useful introduction to the next section of this disclosure where RC time constant mismatch with AC (Alternating Current) signals is being considered.

Looking more specifically at the sampling problem, this is once again a function of the dynamic range of the converter and its maximum bandwidth.

Suppose the converter samples a sinusoid, Vinput, having a dynamic range of 5V at 10 MHz. This has an amplitude of 2.5 V and an angular frequency of $2\pi \times 10 \times 10^6$ radians per second.

$$V{input} = 2.5 \sin(2\pi \times 10 \times 10^6) \qquad \text{Equation 5}$$

The maximum rate of change of voltage occurs around the zero crossing point and is $2.5 \times 2 \times \pi \times 10 \times 10^6 = 157 \times 10^6$ volts per second.

So, 1 picosecond of sampling skew (a timing error) would equate to 157 pV of error. For a dynamic range of 5V and 18 bit resolution, the LSB size was 19 µV. Therefore this small timing skew of 1 ps introduces an error of 8.3 LSB. This timing skew interacts with any variations in RC time constant between stages or slices to increase mismatch errors in the voltage sampled onto each slice.

To address this, the inventors have chosen an architecture where, for each slice, integrated circuit lithographic precision is used to ensure that the capacitors and transistors in each sampling arrangement scale together to maintain a matched RC sampling time constant, and the sampling switches are substantially co-located to minimize timing skew.

In an embodiment where the slices are formed from switched capacitor arrays, each slice includes a sampling DAC, and the sampling stages are matched so as to have capacitors and transistors at a given electrical position in one slice being substantially the same as the equivalent capacitors and transistors in others of the slices.

In an embodiment of this disclosure a unit cell comprising a unit size capacitor C in association with unit sized transistors for connecting one of the plates of the capacitor to VIN, VREF1 and VREF2 respectively is used repeatedly to form the slices. Each unit cell is nominally identical to each other unit cell in its electrical performance. The cells can be grouped together, either permanently or as part of a dynamic allocation of cells to groups or as a mixture of these approaches. Two cells can be permanently grouped together to a "2C" cell as shown in FIG. 7, part b). The 2C cells can then be dynamically grouped together to form C2 having a capacitance of 4C, 8 cells can be grouped together to form C1 and so on. If desired, cells do not need to be grouped together to from groups in a binary sequence of weights. Cells could be grouped to form capacitors to provide redundancy. Cells can also be connected in series to form effective capacitances of C/2, C/3, C/4 and so on.

The slices may be connected to a sub-DAC, such as the one comprising C5 to C9 in FIG. 2.

Figure 9:
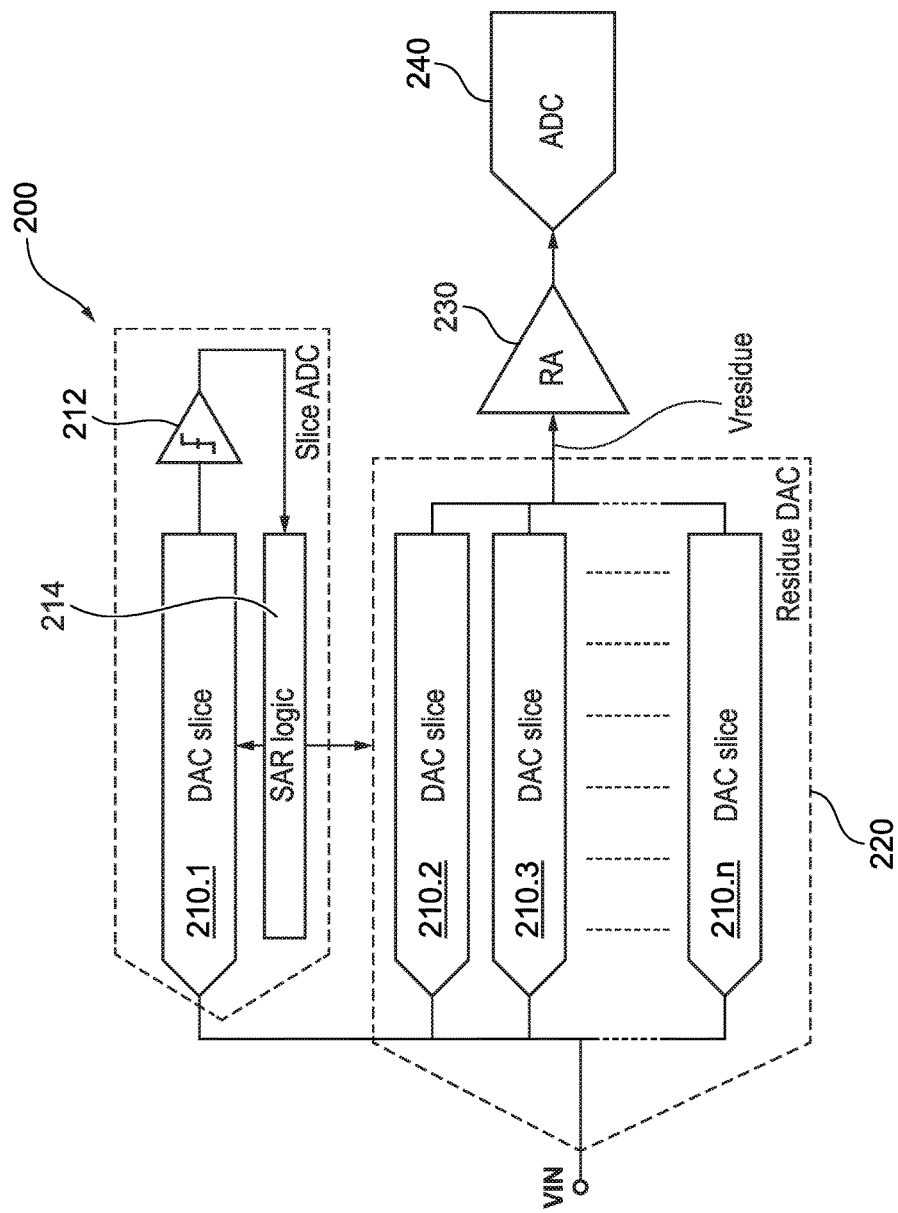
FIG. 9 illustrates a sliced ADC stage operable to form a residue.

FIG. 9 schematically illustrates a circuit (e.g., a first ADC or first ADC stage) 200 constituting an embodiment of the present disclosure. The circuit comprises a plurality of sampling circuits and a plurality of digital to analog converters. The circuit may form the entirety of an analog to digital converter, or more likely is used as a "stage" of a multistage converter, such as a pipelined converter as shown in FIG. 3 or 4 where the pipeline can have two or more stages. In this embodiment switched capacitor arrays are used to form sampling digital to analog converters, with each sampling DAC acting as one slice 210.1 to 210.$n$ of the circuit 200. The slices 210.1 to 210.$n$ are advantageously reconfigurable such that one or more slices 210.1 to 210.$n$ can be associated with a SAR logic 214 and that other ones of the slices can be updated as a function of the SAR output. In this context "updated as a function of" includes the possibility that different ones of the slices may be updated or set to respective values. For the time being, the first slice 210.1 has been coupled to a comparator 212 which provides its output to a SAR logic 214. The SAR controller may be a state machine arranged to drive the sampling DAC slice 210.1 to perform an analog to digital conversion using, in this example, the slice 210.1 to resolve a plurality of the bits of a digital output word.

Some or all of the remaining DAC slices 210.2 to 210.$n$ are configured to sample the input VIN simultaneously with slice 210.1 and to act together to form a residue DAC 220 to form an analog output voltage Vresidue representing the difference between VIN and Vdac, where Vdac is the voltage produced by the residue DAC 220 when driven with the "result" of the analog to digital conversion formed by the first DAC slice 210.1 when driven by the SAR logic 214 to arrive at a P bit conversion, where P is the effective resolution in bits of the slice 210.1.

The first DAC slice 210.1 may be formed from a non-sub-divided switched capacitor array as shown in FIG. 1, a segmented or sub-divided switched capacitor array as shown in FIG. 2 or a sampling capacitor and associated DAC. Given that sub-divided arrays as shown in FIG. 2 are commonly used because of their relative compactness, then for the purposes of this part of the description, the slice 210.1 comprises a sub-divided array like that shown in FIG. 2.

In such an arrangement, the sampling DAC stage 73, as shown in FIG. 2, is connected to a sub-DAC (stage) 75. The other slices can be formed so as to be identical to the first slice 210.1, i.e., including both a sampling DAC stage and a sub-DAC. However, it is also possible to use a shortened sub-DAC or to omit the sub-DAC all together as long as the coupling capacitance is adjusted and coupled to ground or placed in series with a capacitance replicating the capacitance of the sub-DAC. As noted earlier, not every capacitor within the sampling DAC stage (capacitor DAC) 73 needs to sample the input VIN.

In use, each of the slices 210.1 to 210.$n$ is coupled to VIN and used to sample VIN. The sampling switches (see switch 82 of FIG. 2) of the slices are co-located to ensure that they receive their "hold" instruction at the same time and also to ensure that each switch suffers the same process, voltage and temperature (PVT) variation as each other switch. This helps ensure that each sampling DAC circuit has the same electrical performance as each other sampling DAC, for example matched RC time constants, and the switches transition between conducting and non-conducting at the same slew rate and at the same time, thereby avoiding phase shifts between the DAC slices 210.1 to 210.$n$ when operating concurrently to acquire, (for example sample and hold) a shared input signal.

After the input signal has been acquired, the first DAC slice 210.1 can be used to form a successive approximation routine conversion of the sampled signal. Such a conversion may include use of a further ADC, for example in the form of a Flash ADC to provide a near instantaneous conversion of the first two or three bits of the P bit conversion performed by the DAC slice 210.1. SAR conversions can also include the inclusion of additional bits to provide redundancy in the result and that the conversion can also be performed with radix <2 technology and that multiple bits can be determined in a single bit trail period, for example, by using a three level quantizer in place of the comparator. As the bit trial progresses, the status of the most significant bits of the P bit output word become known before the status of the least significant bits of the P bit output word. This allows the output from the SAR logic 214 to be provided to the slices 210.2 to 210.$n$ in the residue DAC 220 in order to set the bits in those DAC slices on a bit by bit basis thereby allowing the voltage transitions caused by switching the capacitors in each slice into an appropriate configuration, and the ringing that this may introduce, has time to die away before the output from the residue DAC 220 is gained up by the residue amplifier 230.

In order to reduce the magnitude of voltage transitions the setting of the bits in the slices 210.2 to 210.$n$ within the residue DAC 220 can be staggered in time such that the transitions do not happen in unison. Furthermore, the magnitude of the initial transitions, for example relating to the most significant bit and the next most significant bit can be reduced by initially setting half of the slices 210.2 to 210.$n$ with their most significant bits set and the other half of the slices with their most significant bit unset. Consequently, as a result of the first bit trial statistically only half of the DAC slices are likely to have to be transitioned. The same technique can be used with the next most significant bit and so on. An alternative approach may be based on the fact that, in use, the input signal may be oversampled compared to its Nyquist frequency limit and hence statistically the first few bits of the input word are unlikely to have changed between one sample and an immediately following one.

It is also possible to allow one or more DACs within the residue DAC to participate within several of the bit trials. Put another way, if only DAC slice 210.1 is being used to perform analog to digital conversions then that single DAC slice can only perform one bit trial at a time. However if three of the DAC slices, for example 210.2, 210.3 and 210.4 of the residue DAC 220 are temporarily enabled to work with respective comparators (not shown) coupled to the SAR logic 214 then the arrangement shown in FIG. 9 can perform two bit trials simultaneously, thereby reducing the time required for the first ADC stage 200 to convert P bits.

The use of the slice arrangement allows each DAC slice 210.1 to 210.$n$ to have a smaller capacitance therein, which reduces the RC time constant of each DAC slice, and consequently a conversion could be performed more quickly. Earlier on in this description, the thermal noise associated with a capacitor at 300 K was tabulated. This was used to show that, in a worked example where a dynamic range of 5 V was to be converted with 18 bit resolution, then the minimum capacitance of the DAC needed to be at least ~40 pF. However, if all of the DAC slices where formed such that they each had an effective capacitance of 4 pF then connecting the DAC slices 210.2 to 210.$n$ to form a residue DAC places their capacitances in parallel. Thus, if 10 DAC slices 210.2 to 210.11 were provided in the residue DAC 220, then connecting them in parallel would create an effective capacitance of 40 pF even though each residue DAC had the superior sampling time and settling speed associated with being a 4 pF DAC slice. It should further be noted that the residue at the output of the first DAC slice 210.1 can also be connected to the output of the residue DAC 220 such that it also contributes to the reduction of thermal noise of the bank of capacitors.

Figure 10:
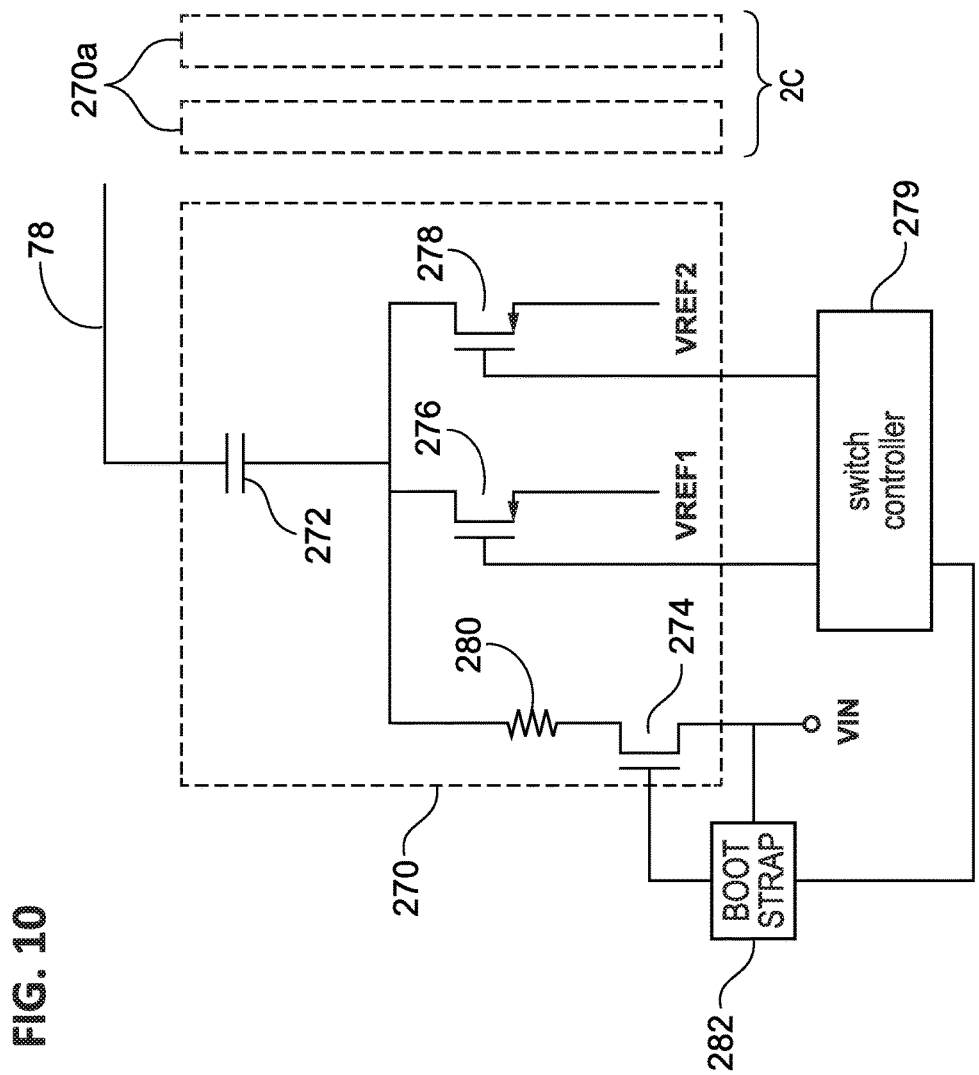
FIG. 10 illustrates a unit cell.

As noted earlier, the sampling DACs can be formed from repeated unit cells. One such unit cell 270 having a value 1C is shown in FIG. 10. The unit cell comprises a capacitor 272 having a value of 1C. One of its plates, the uppermost plate in FIG. 10, is connected to the shared conductor 78 (FIG. 2). The bottom plate of the capacitor is connected by a three-way switch formed of transistors 274, 276, and 278 to allow the bottom plate to be isolated, connected to VIN, VREF1 (typically from a precision voltage reference such as reference circuit 12 from FIG. 1) or VREF2 (typically 0V or ground). Each of the transistors is controlled by a switch controller 279, such as SAR logic 214 from FIG. 9. The transistor 274 connecting the capacitor to the input node VIN may be in series with a resistor 280 so as to more accurately define the "on" resistance presented by the unit cell when it is sampling the input signal at VIN. The transistor 274 may have its gate control signal modified by a bootstrap circuit 282 so as to hold a gate to source voltage Vgs of the transistor 274 constant with respect to VIN. The unit cell 270 may be placed in parallel with other unit cells to form properly scaled combinations of switch and capacitor, as represented by unit cells 270a and 270b being placed in parallel to form a 2C weight, and so on.

The question then arises as to how to improve shuffling schemes to take advantage of this sliced architecture.

Shuffling can be applied in the sliced architecture, but where the sampling DAC is sub-divided into first sub-array 72 and second sub-array 74 by the coupling capacitor 76, the coupling capacitor interferes with the averaging obtained by shuffling.

If, for example, each sub-array 72 and sub-array 74 were formed from 3 unit cells, then shuffling applied to the sub-array 72 would statistically smear any weight error out such that the effective value of each cell would become S1, where S1 is very close to C1. Similarly shuffling the cells in array 74 would result in any weight errors being smeared out such that the effective value of each cell would become S2, where S2 is very close to C1. However it is unlikely that S1 and S2 would be identical, but they would be very close.

Having multiple slices allows bit values less than the LSB of the first sub-array, i.e. less than B4, to be encoded by driving the slices with different data words.

The inventors realized that this allowed for the benefits of shuffling to be extended at least partially across the boundary formed by the coupling capacitor such that S1 and S2 would be closer in value than in a conventional shuffling scheme.

Figure 11:
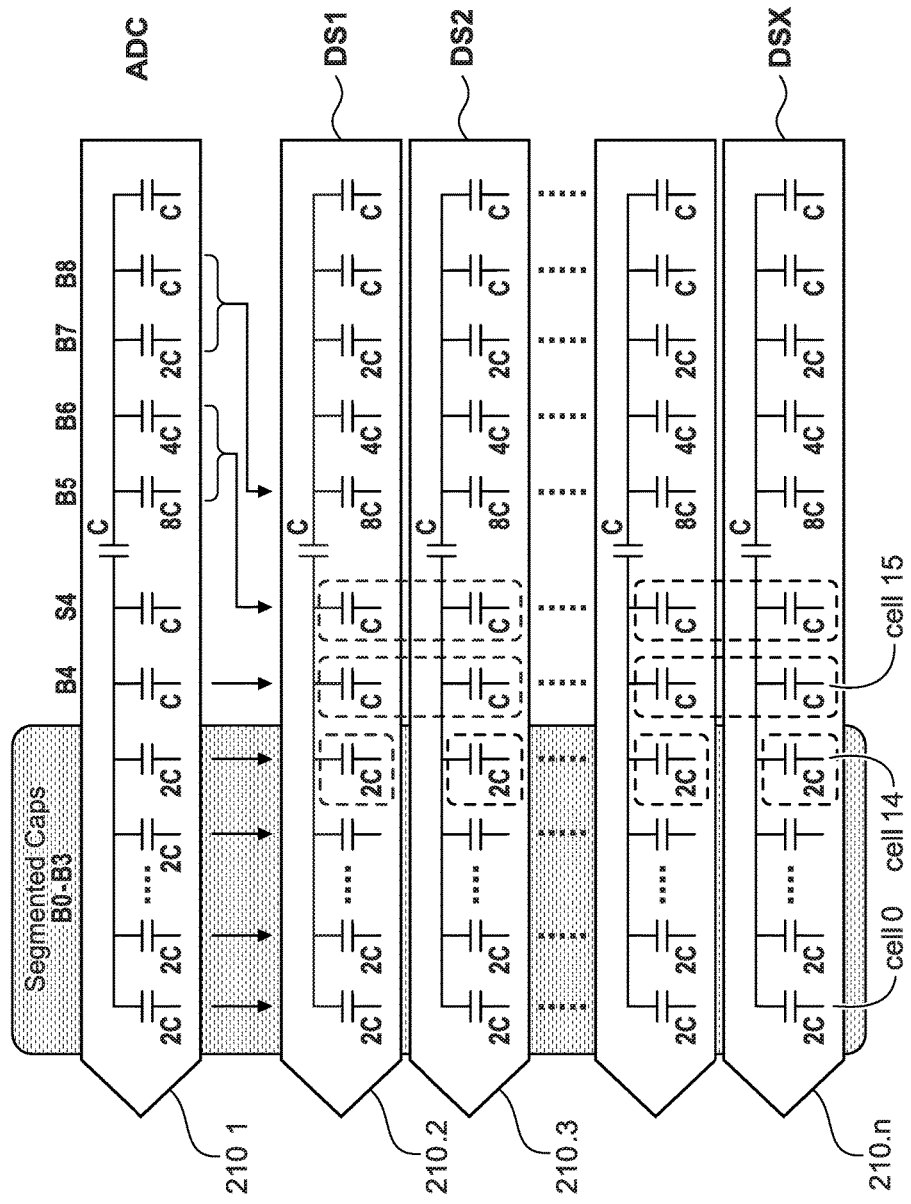
FIG. 11 shows an embodiment of FIG. 9 in greater detail.

FIG. 11 shows the slices of FIG. 9 in greater detail. For the purposes of this discussion the slices 210.1 to 210.N have been functionally divided such that slice 210.1 forms the ADC of the stage, and the slices 210.2 to 210.N form the sampling DAC slices DS1 to DSX.

To keep the switch count down, the first sub-array 72 of each DAC slices is formed in thermometer encoded style, with generally double weight (2C) unit cells, cell 0 to cell 14, as was described with respect to FIG. 7, part b). A single weight cell, cell 15, is also provided as described with respect to FIG. 7, part b). This cell always forms B4, in this example, as B4 is the bit whose value is so small that it must be represented by the single 1C cell. A further single weight cell, S4, is also provided. This can be regarded as being one element of a first group of elements (in this example, the capacitors of the first sub-array 72) which is controllable in response to a bit value based on the data words applied to a second group of elements (sub-array 74) of the slices.

The first sub-array 72 can be regarded as a main DAC within the slice as it handles the most significant bits of the DAC conversion and the sub-array 74 can be regarded as forming a sub-DAC.

The sub-array 74 which is not included in sampling is formed from binary weighted capacitors (in this example) although these could be split into unit-cells like in the main (first) sub-array 72.

Figures 12, 13:
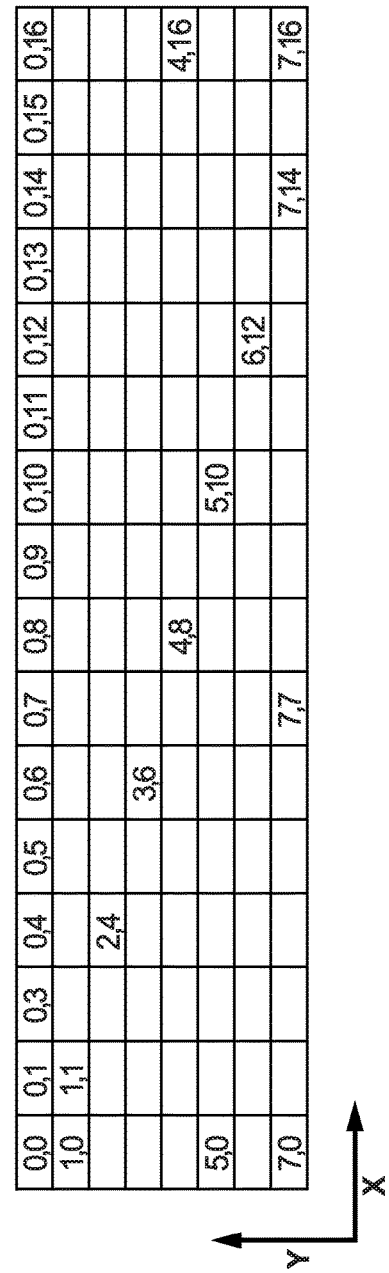
FIG. 12 schematically illustrates a simple addressing scheme for the cells within the sampling parts of the DAC slices.
FIG. 13 schematically illustrates a two dimensional addressing scheme that simplifies the shuffler design.

The cells in the sub-arrays of the slices become available to participate in more complex shuffling schemes. As shown in FIG. 12, the cells of the first sub-arrays 72 of the slices could be sequentially numbered 1 to 128 (or 0 to 127) forming a one-dimensional array of cells for the shuffler to control.

However, the sliced architecture enables the designer to adapt a two dimensional array of cells, and have shuffling controlled along a first index, such as an the X axis and shuffling also applied to reduced cohorts of cells along a second axis, such as the Y axis. This approach allows an enhanced shuffling performance to be obtained without having to implement a complex (and large) shuffler.

FIG. 13 shows a two dimensional addressing scheme which simplifies the shuffler design, each cell within a sampling DAC slice is addressed by one index, and each slice is addressed by another index. This approach can be used to enhance resolution and/or to reduce matching errors over more bits of the ADC.

Figure 14:
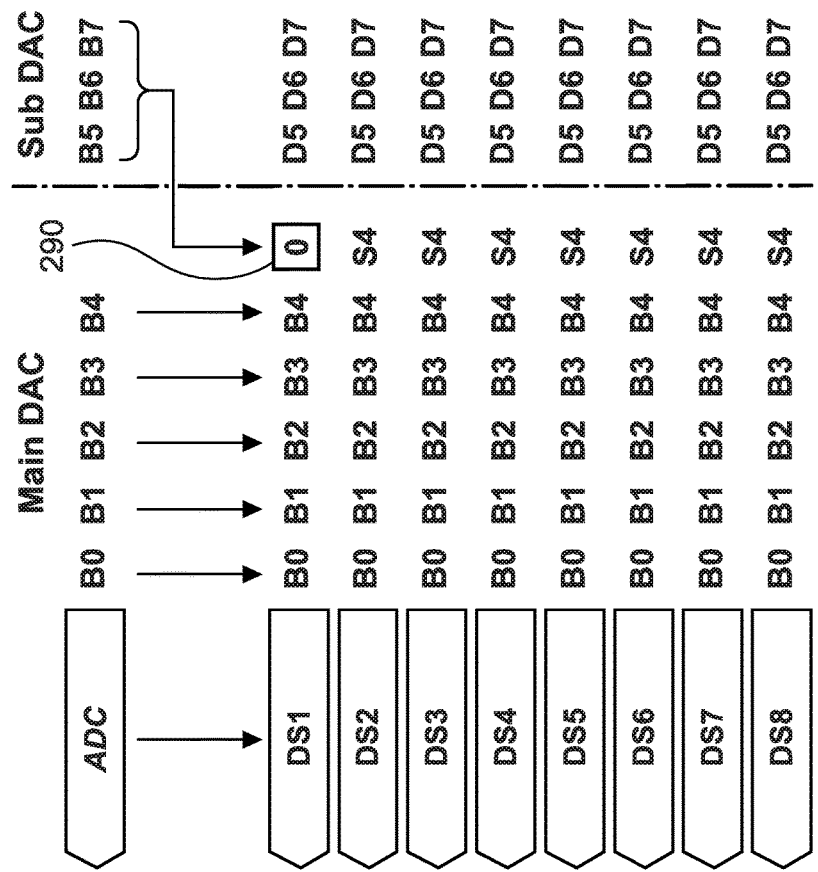
FIG. 14 shows a first encoding scheme whereby the resolution from the slices exceeds that of any individual slice.

In a simple approach as shown in FIG. 14, the value of B0 from the ADC could be applied to B0 of each slice DS1 to DS8. Similarly B1 from the ADC always goes to capacitors B1 in the slices and so on.

Bits B5, B6, and B7 can be encoded by setting S4 in the slices individually such that between 0 and 7, inclusive, switches for S4 are set depending on B5, B6, and B7. Thus the bit values of B5, B6, and B7 that were horizontally encoded in each slice can now be vertically encoded over the slices DS2 to DS8, in this example, using S4. This approach leaves one cell, 290, that is not required. It can be set to "0" as shown in FIG. 14, or may be used for a task such as applying a dither.

Figure 15:
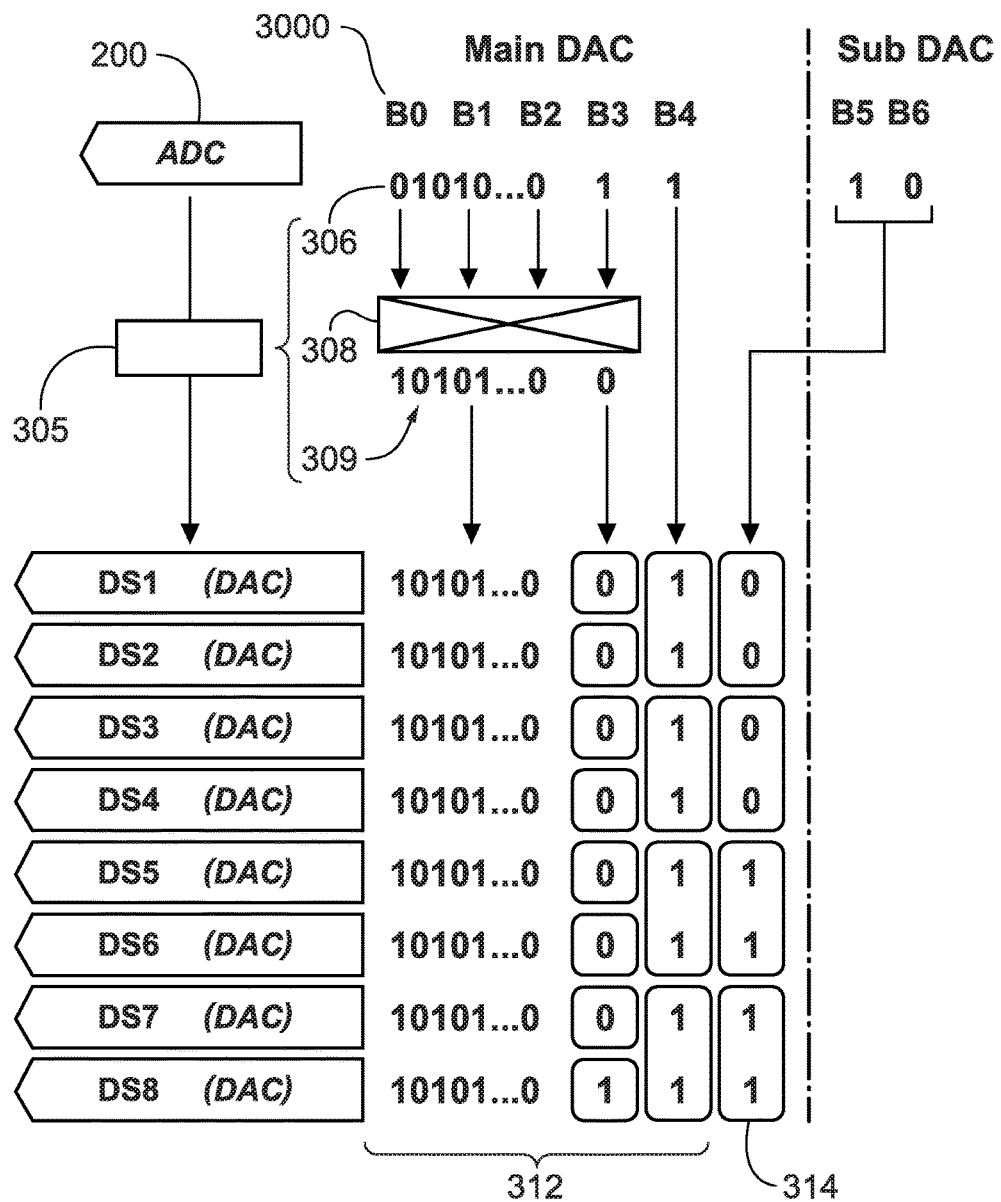
FIG. 15 shows an encoding scheme having one level of shuffling.

FIG. 15 shows how the arrangement shown in FIG. 14 can be modified to include a first level of shuffling. Bits 0 to 3 are now provided to a shuffler such that their value becomes randomized across the "2C" cells, cell 0 to cell 14 of FIG. 11. Each slice can be provided with the same shuffled data word for selecting cells 0 to 14 so as to encode the values of B0, B1, B2 and B3.

The ADC 200 performs its conversion and outputs a digital word 3000. The digital word 3000 may be binary encoded, unary encoded or may be a mixture of encoding styles. In the example shown in FIG. 15, the digital word 3000 is diagrammatically represented as a binary word with bits B0 to B4 representing a first part of the word and bits B5 and B6 representing a second part.

A data word generator 305 receives the digital word. If the digital word is binary encoded the data word generator is arranged to transform the binary data for a first portion of the word into a unary encoded form 306, or to a pseudo unary form. In this context "pseudo unary" means most of the bits in the data word are encoded with the same weight, but a one or a small number are encoded to represent a different weight. Here bits B0 to B3 are converted to a unary encoded form to be supplied to the 2C cells of FIG. 7, part b).

Following conversion (if necessary) to unary encoding the data word generator 305 can perform a shuffling operation 308 to provide a shuffled output 309.

The data generator may also process data from B5 and B6 which will be encoded into S4. Thus the output of the data word generator 305 is a data word which comprises a first portion 312 which is shared by DS1 to DS8, such that the columns of cells in DS1 to DS8 which have been allocated to receive the data from B0 to B3 (or B0 to B4) are set identically for each DAC. The first portion 312 is a result of a horizontal shuffling operation. The data word also comprises an additional portion 314 which contains one or more columns of data which are not the same in each DAC.

In this example, no shuffling is applied to B4. The value of B5 is encoded by cells S4 in four of the slices, and B6 is encoded by the value of cells S4 in two of the slices. The encoding can be static. In this example B5 is encoded by S4 in slices DS5, DS6, DS7, and DS8. Thus S4 in these slices is "1" if B5 is "1" and is "0" if B5 is "0". Similarly B6 is encoded by S4 in DACs DS3 and DS4. S4 in DACs DS1 and DS2 is always set to zero.

By moving some of the sub-DAC bits (second array 74) into the main DAC (first sub-array 72), the converter achieves improved weight matching between the information in the main DAC and information that used to be implemented in the sub-DAC, and the removal (or at least a significant reduction) in gain errors between bits B5, B6 and B7 of the sub-DAC and bits B0, B1, B2, B3, and B4 of the first array acting as a sampling DAC within each of the slices. By encoding, for example, the value of bits B5, B6, and B7 vertically between the sampling DACs DS1 to DS8 by use of the extra sampling capacitor S4 in each slice the bits B5, B6 and B7 in the sub-DAC become available for other tasks, such as dithering and redundancy.

Figure 16:
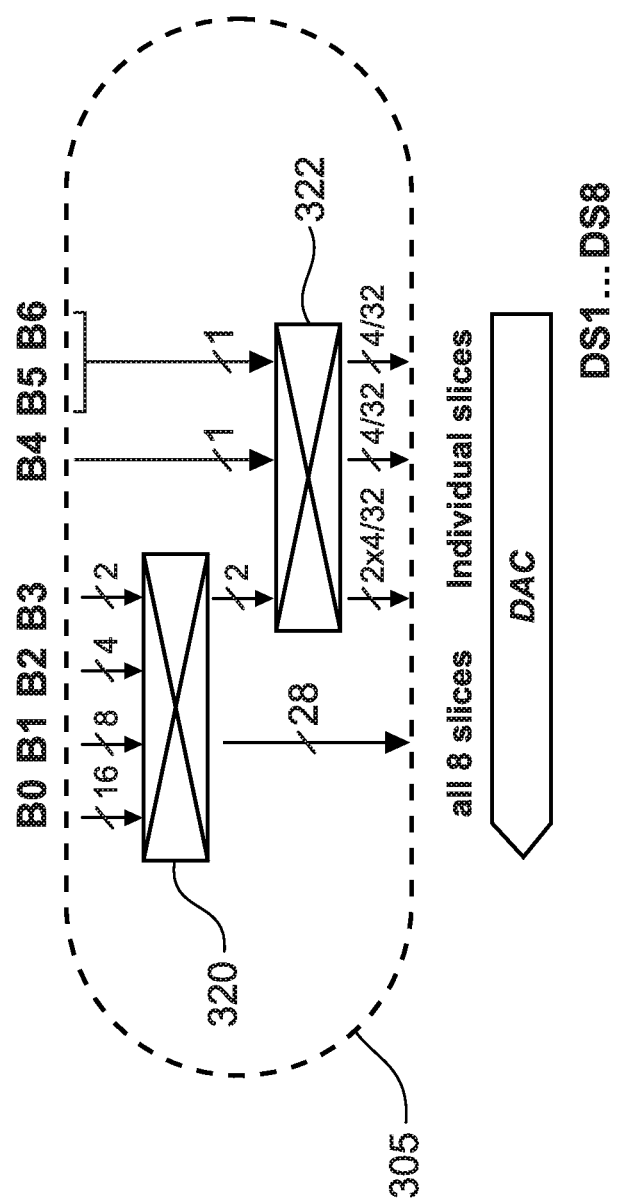
FIG. 16 shows a further embodiment of this disclosure using a two stage shuffling scheme.

FIG. 16 shows a hardware schematic for a further embodiment of this disclosure. Two shufflers 320 and 322 are provided within the data word generator. Shuffler 320 receives the unary converted bit signals B0 to B3 for the main DAC portions of the sampling DACs DS1 to DS8 formed of the DAC slices 210.1 to 210.9.

These bits are operated on the shuffler 320. However, two column select signals of the shuffler 320 output are provided as an input to the second shuffler 322. The first shuffler 320 also selects 28 columns of cells used to encode B0, B1, and B2 and drives these columns directly.

The two column signals that are not used to drive the DAC slices directly as shuffled by shuffler 320 as well as data signals for bits B4, B5, and B6 are provided to the second shuffler 322 which shuffles cell selection in the vertical (Y) direction of the cell array as shown in FIG. 13.

The second shuffler 322 has to be arranged to take account of the relative cell weights that the second shuffler 322 has access to. Thus the total weight of the bits to be enabled by the shuffler 322 is calculated by the shuffler and selected from the double weight cell B3 and the single weight cells B4 and S4 as appropriate.

Figure 17:
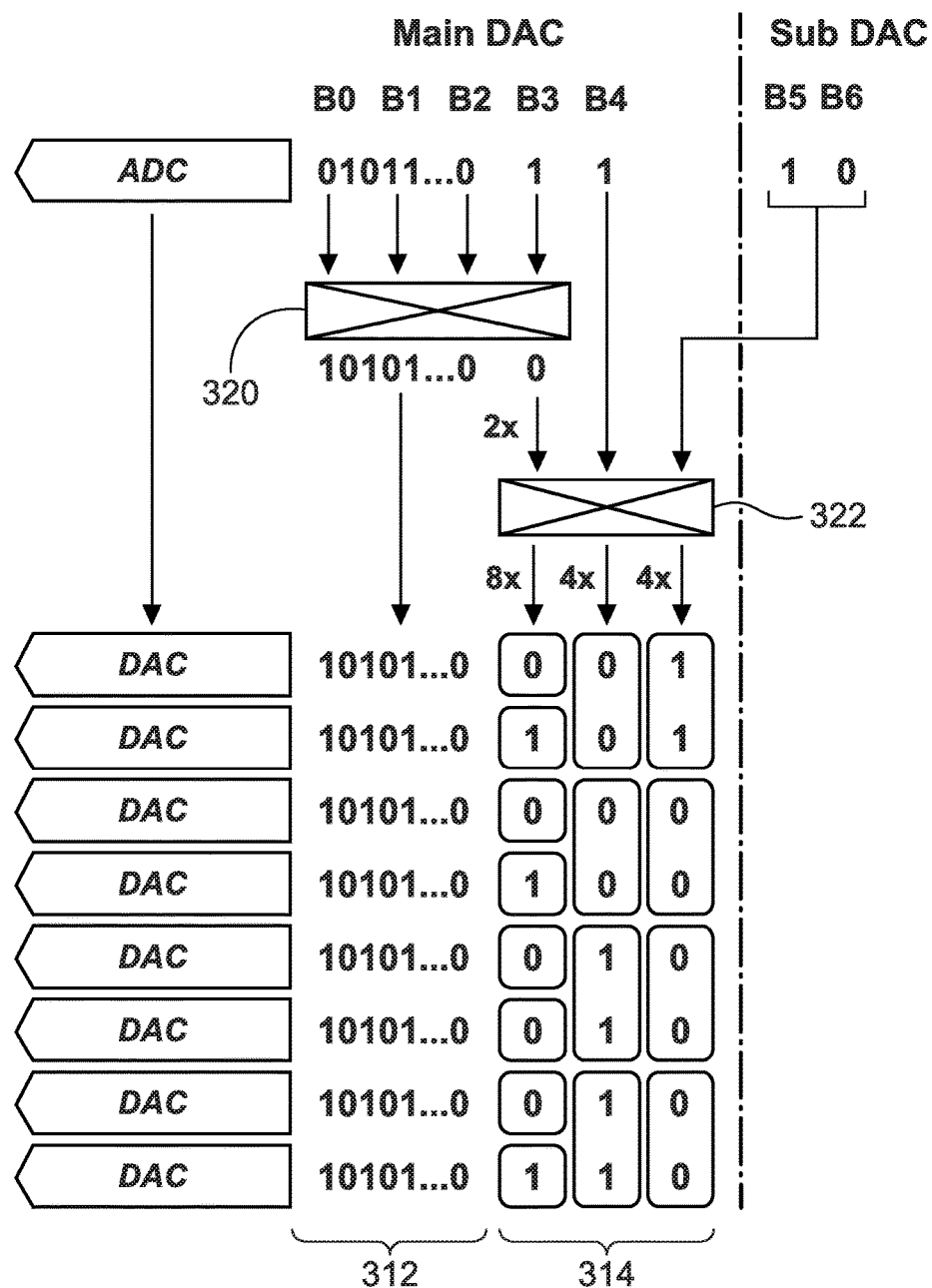
FIG. 17 is a diagram exemplifying the two stage shuffling scheme in greater detail.

In the example shown in FIG. 17, the first shuffler 320 had made its selection such that B0 to B3 had been encoded into the 28 cells driven directly by the first shuffler 300, such that two O's had been passed from the first shuffler to the second shuffler 322.

The second shuffler 322 receives the unary encoded information from the first shuffler 320, and from B4, B5 and B6 and uses that information to shuffle the cell selections two columns of the double weight cells, over the B4 dedicated column of single weight cells and over the S4 column of single weight cells. This shuffling can be regarded as a vertical (Y direction) shuffle compared to the first shuffler's horizontal (X direction) shuffle. Again the data word from the data word generator 305, which includes the shufflers, comprises a first portion 312 which is common to all of the DACs DS1 to DS8 and an additional portion 314 which represents the result of vertical shuffling data.

This shuffling scheme described with respect to FIGS. 16 and 17 improves the integral non-linearity performance of the array of segmented DACs. In tests for a test device, INL was reduced by approximately a factor of four when two stage shuffling scheme was implemented.

Figure 18:
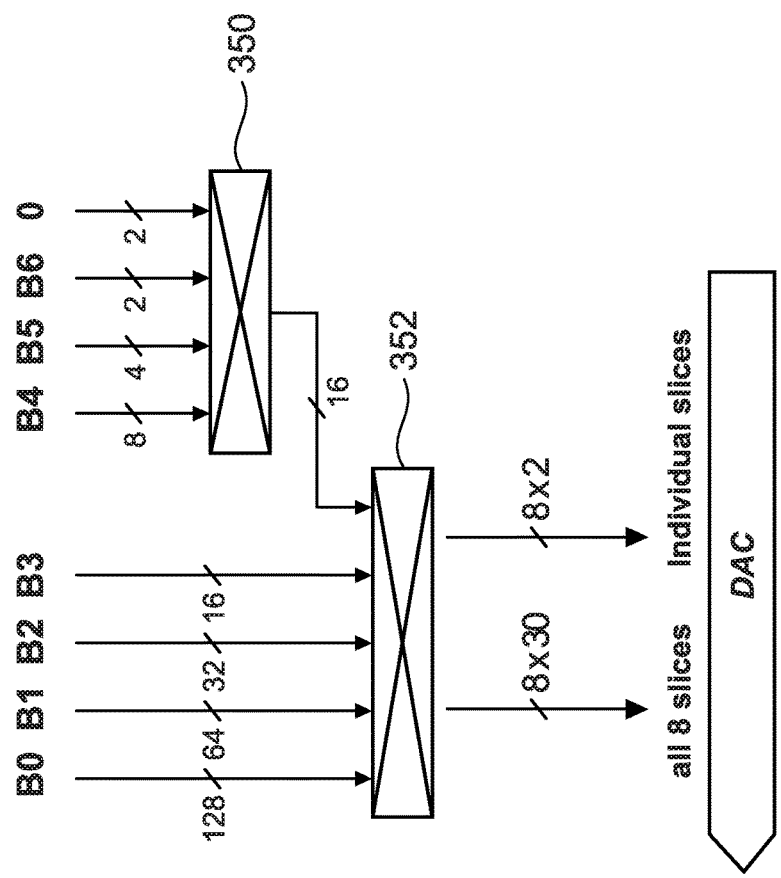
FIG. 18 shows in conceptual form a further arrangement of the shufflers constituting another embodiment of this disclosure.

The inventors noted that the order of the shufflers can be changed. FIG. 18 shows an arrangement where a least significant bits shuffler 350 receives bits B4, B5 and B6. Bits B5 and B6 correspond to bits on one side of the coupling capacitor of the sub-divided DAC array and bits B0 to B3 correspond to bits on the sampling side of the sub-divided DAC array (although this technique can also be used with a non-sampling DAC). Bits B0 to B3 have been converted to unary encoding, for example using a unit cell of weight 2C (across 8 DACs=16c).

The least significant bits shuffler 350 is arranged to be able to vertically shuffle in one or more columns, in this example one column, of the sliced DAC formed by DS1 to DS8. This means the least significant bits shuffler has control over 8 cells. If these cells are double weight cells then the shuffler has control over a weight of 16C. Therefore the shuffler 350 receives a four bit input word, which is a unary encoded representation corresponding to B4, B5, B6 and an additional input, which in this example is permanently set to zero and has a weight equal to B6 in the lower bits shuffler weighting that it applies to its inputs.

The output from the least significant bits shuffler 350 is combined with the most significant bit data in a most significant bits shuffler 352, the first shuffler, which receives B0, B1, B2 and B3 data, and also is responsive to the least significant bits shuffler, and provides a column of cells selection scheme based on the input data.

Figure 19:
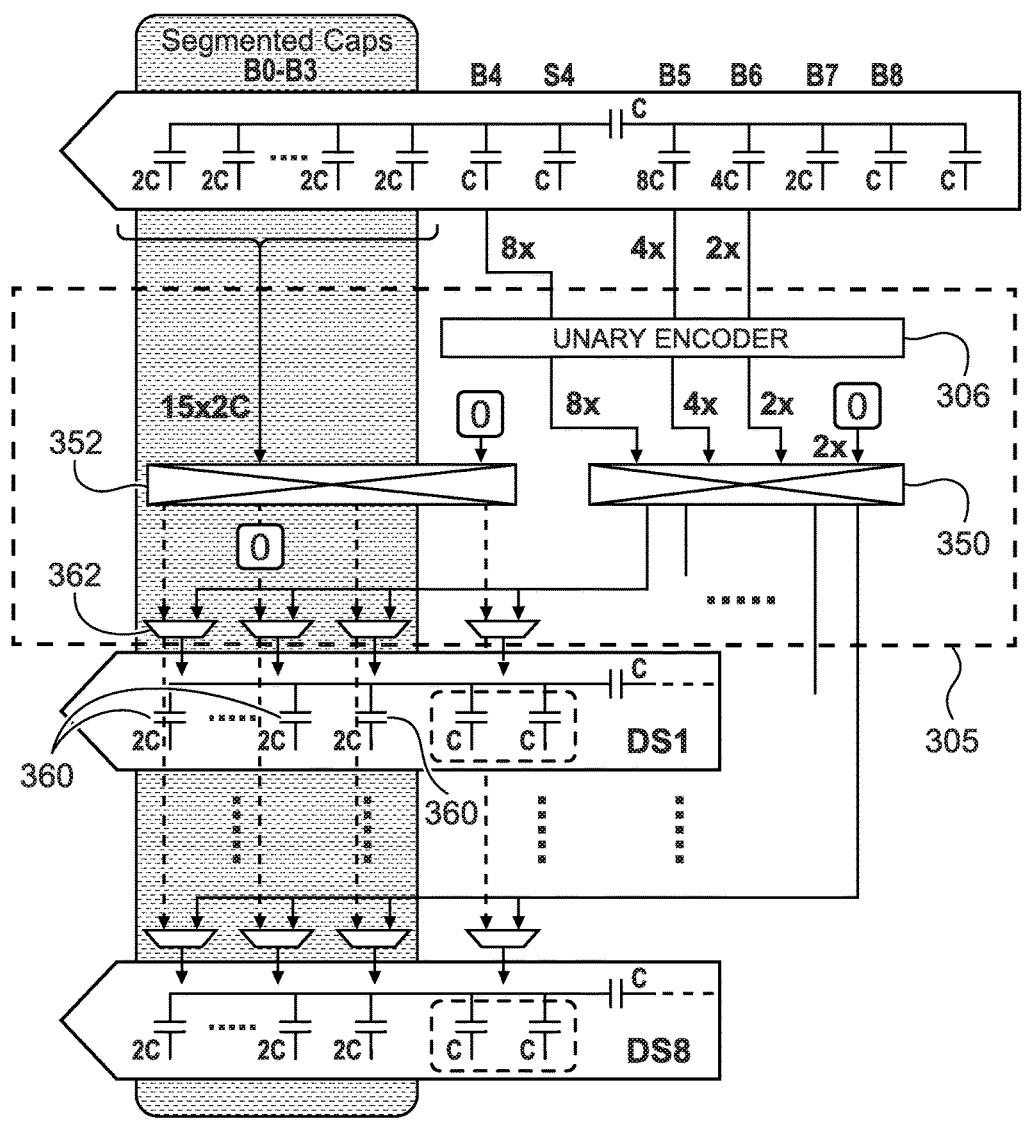
FIG. 19 is a circuit diagram of a further implementation of a shuffled slice DAC.

FIG. 19 shows how the outputs of the two shufflers 350 and 352 within the data word generator 305 can be implemented in an efficient hardware solution. Each cell, i.e., capacitor and associated switch is driven by a respective multiplexer. In this example the first one of the double weight cells, e.g., 0 to 14 of FIG. 7, part b), in DS1 is labelled as 360 in FIG. 19 and the transistor switches of the cell are controlled in response to the output of signal gate. The signal gate 362 could be implemented by a Boolean AND function, by inverters and an OR function, or by a multiplexer where one input receives the output of the shuffler 352, a second input receives "0", and the select input is driven from one of the outputs of the least significant bit shuffler.

A first output of the least significant bit shuffler 350 is provided as a control to each of the signal gates 362 associated with in DS1. Similarly another of the outputs is directed solely towards the signal gates of DS2 and so on, up to DS8.

Figure 20:
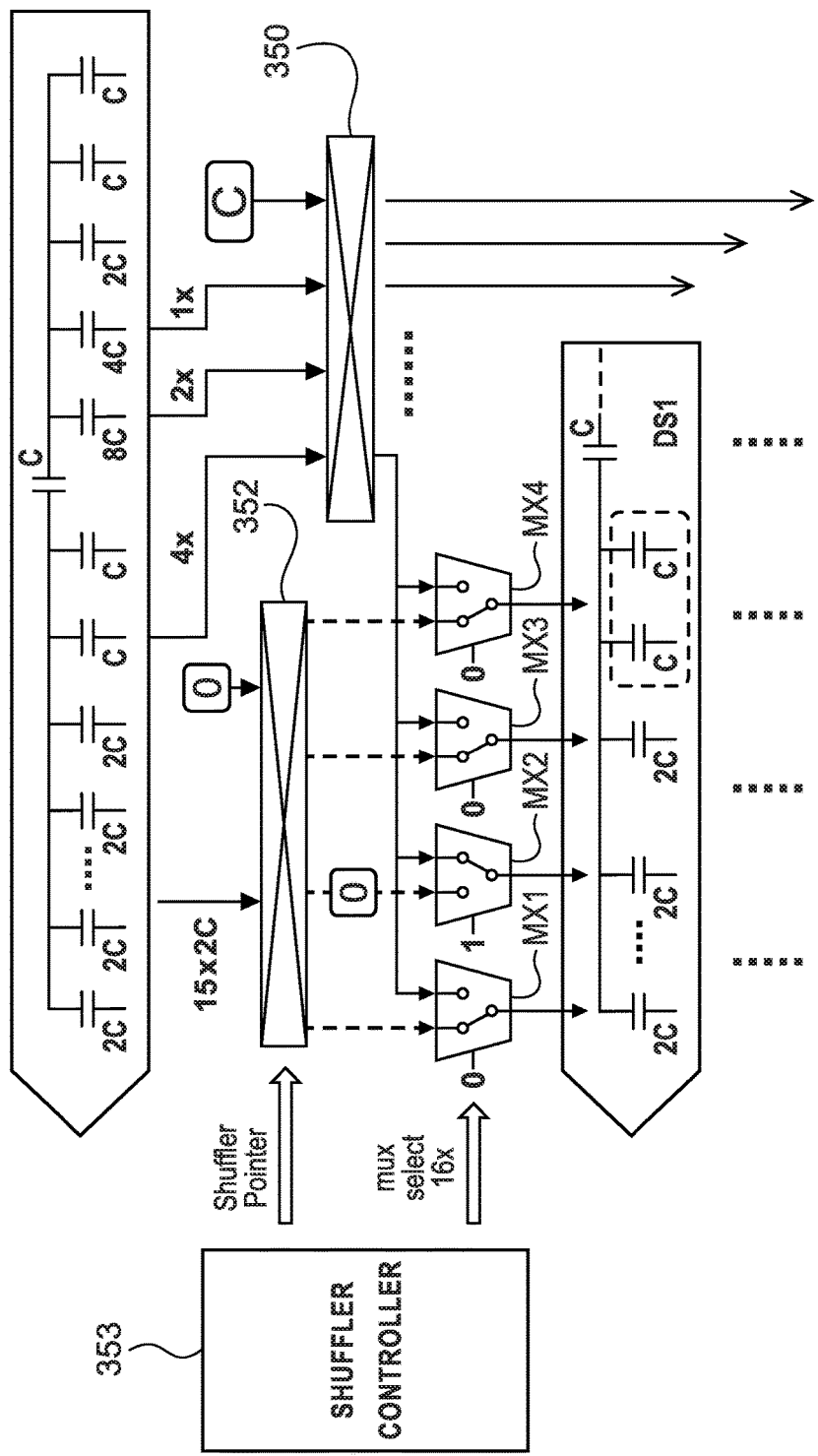
FIG. 20 shows an implementation of a shuffled slice DAC in further detail.

FIG. 20 shows an implementation of FIG. 19 in greater detail. Specifically it shown that the cells in the first sub-array 72 of each slice (here only the slice forming DS1 is shown for diagrammatic simplicity) are controlled by respective multiplexers MX1, MX2, MX3, and so on. A first input of each of the multiplexers is connected to a respective output of the second shuffler 352. A second input of each of the multiplexers are connected together and to a respective output of the first shuffler 350. The multiplexers are controlled by a multiplexer select signal from a shuffler controller 353.

In use, one of the inputs of the second shuffler 352 is always set to "0" so as to reserve a column of cells within the DACs DS1 to DS8 for use in vertical shuffling. The shuffler 352 randomly shuffles this reserved column to one of the columns of unit cells. The shuffler controller 353 drives the multiplexers to select the output of the first shuffler 350 to be directed towards the column of cells that have been allocated to the reserved column, and to select the outputs of the second shuffler for the other columns.

The resultant operation will now be explained with respect to FIG. 21.

Figure 21:
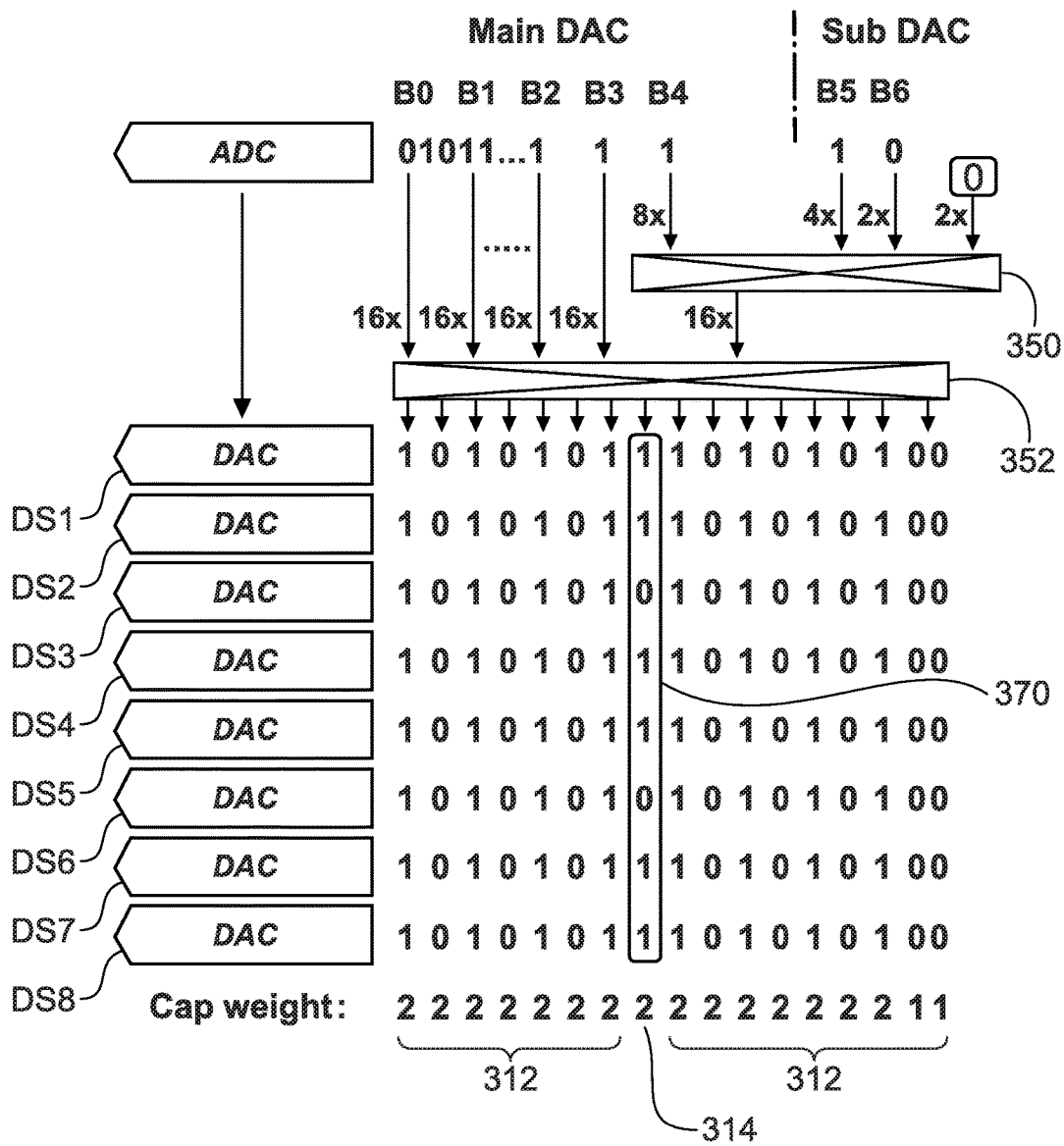
FIG. 21 shows an example of an input word to the sliced DAC and how that word may be encoded and used to control the DAC slices.

FIG. 21 shows the DAC slices DS1 and DS8 down the left hand side of the Figure. It also shows the sequentially connected shufflers 350 and 352. Where the inputs are binary weighted bits B0 to B6, there are converted into a unitary weighting (like thermometer encoding) and then randomly spread over the capacitor cells by the first shuffler 352.

The relative weights of the capacitor cells within the DAC slices DS1 to DS8 are indicated along the bottom of FIG. 21. In this example there are 15 cells of weight 2C, and 2 cells of weight 1C, making a total of 32C. 30C encode B0 to B3, and 2C encode B4 to B6 and extra information.

In the example discussed with respect to FIG. 14, B4 (equivalent weight of 1C) was always encoded to a unit size capacitor cell, and the values from the sub-DAC was encoded vertically across the S4 capacitor cells. However in the circuit shown in FIGS. 19 and 20 and described with respect to FIG. 21, the values of B4 as well as B5 and B6 participate in such a way that their values are not mapped to any given one of the vertical columns of "2C" cells but instead are mapped to a column of cells on a randomized basis and then shuffled vertically as well, as indicated by shaded column 370 in FIG. 21.

This shuffling is relatively straightforward to implement, as most of the shuffling across the slices is in one direction only, i.e., "horizontal" in FIG. 21 to represent that the same shuffle can be applied to each of the slices, except for a small amount of vertical shuffling applied to the randomized column 370, and any vertical shuffling that might also be applied to the single weight pair of "1C" columns. Thus, the data word provided by a data word generator 305 including the shufflers 350 and 352 comprises a shared portion 312 and an additional portion 314.

This shuffling scheme further reduces the impact of size errors between the cells and gives rise to further improvements in INL errors.

It can be seen that the use of sliced architecture can be advantageously employed to gain speed improvements without sacrificing noise performance by virtue of the slices being able to each have a lower capacitance to give faster conversion of the input signal while having their outputs combined to provide an effective larger capacitance and hence less noise. Furthermore the random variation in capacitor sizes between slices, together with the use of shuffling both within each slice and across the slices provides for reduced INL problems.

Further speed improvements may be obtained by accepting more noise in the ADC part 200 as this noise does not get propagated through to the residue.

Figure 22:
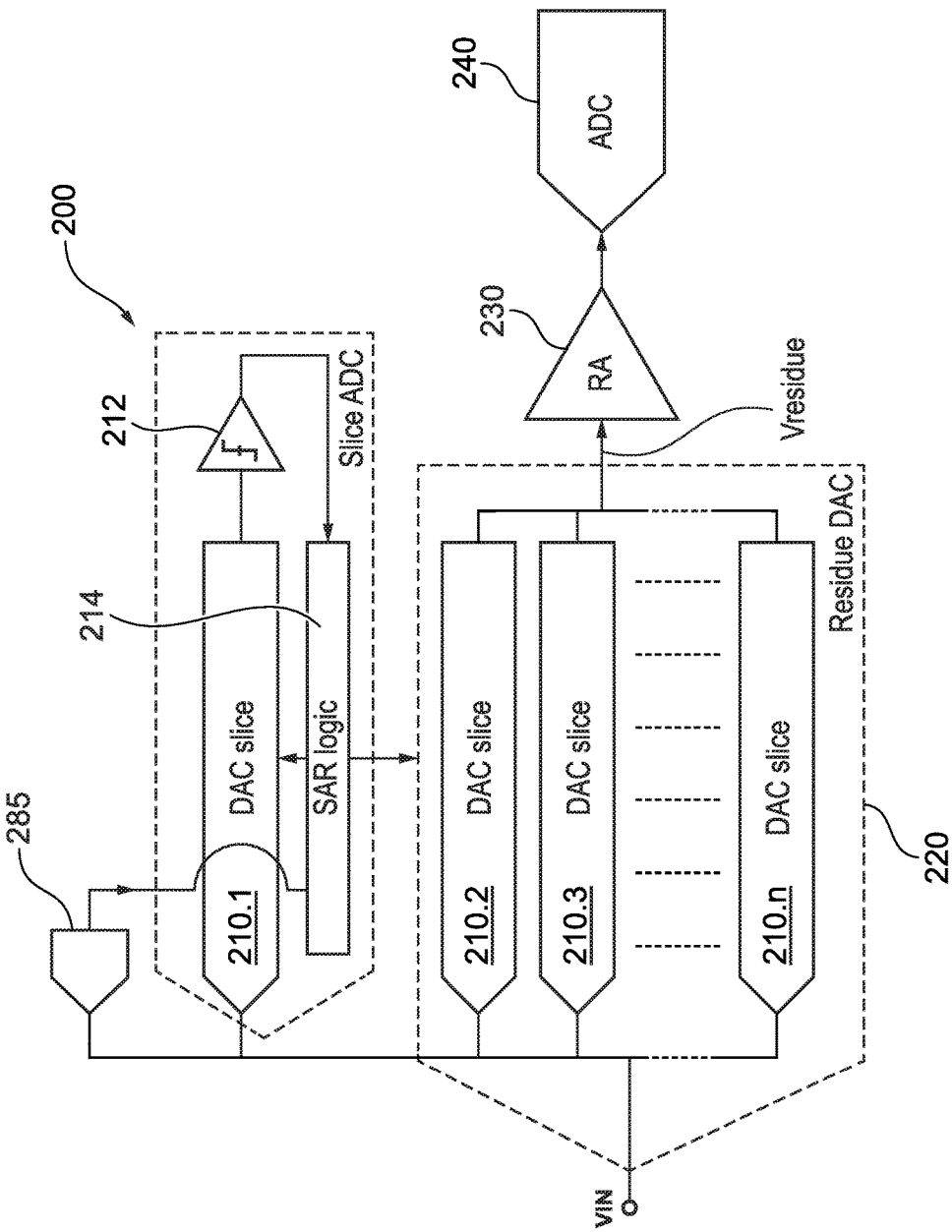
FIG. 22 shows an ADC where a residue forming stage includes a mini-converter to increase the speed of the ADC process.

FIG. 22 shows a variation of FIG. 9 where an ADC 285, such as a 3 bit Flash converter, is used to set the three most significant bits of the SAR converter more quickly. Less than or more than 3 bits may be converted by the Flash converter (ADC) 285.

Figure 23:
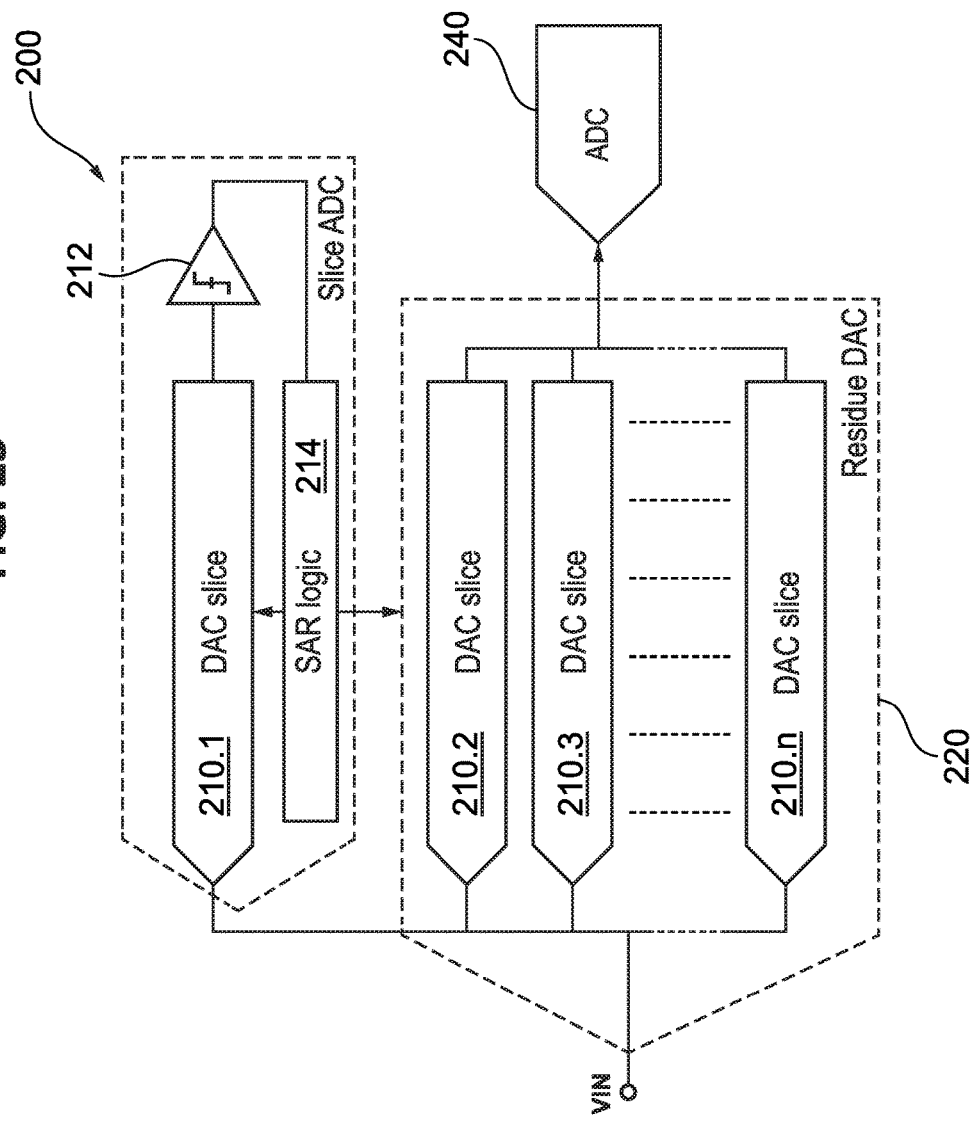
FIG. 23 shows a further variation of an ADC section constituting an embodiment of the present disclosure.

The voltage residue may then be gained up by a residue amplifier 230 before being provided to a further analog to digital converter 240. It should also be noted, as shown in FIG. 23, that the residue amplifier 230 need not necessarily be provided.

Figure 24:
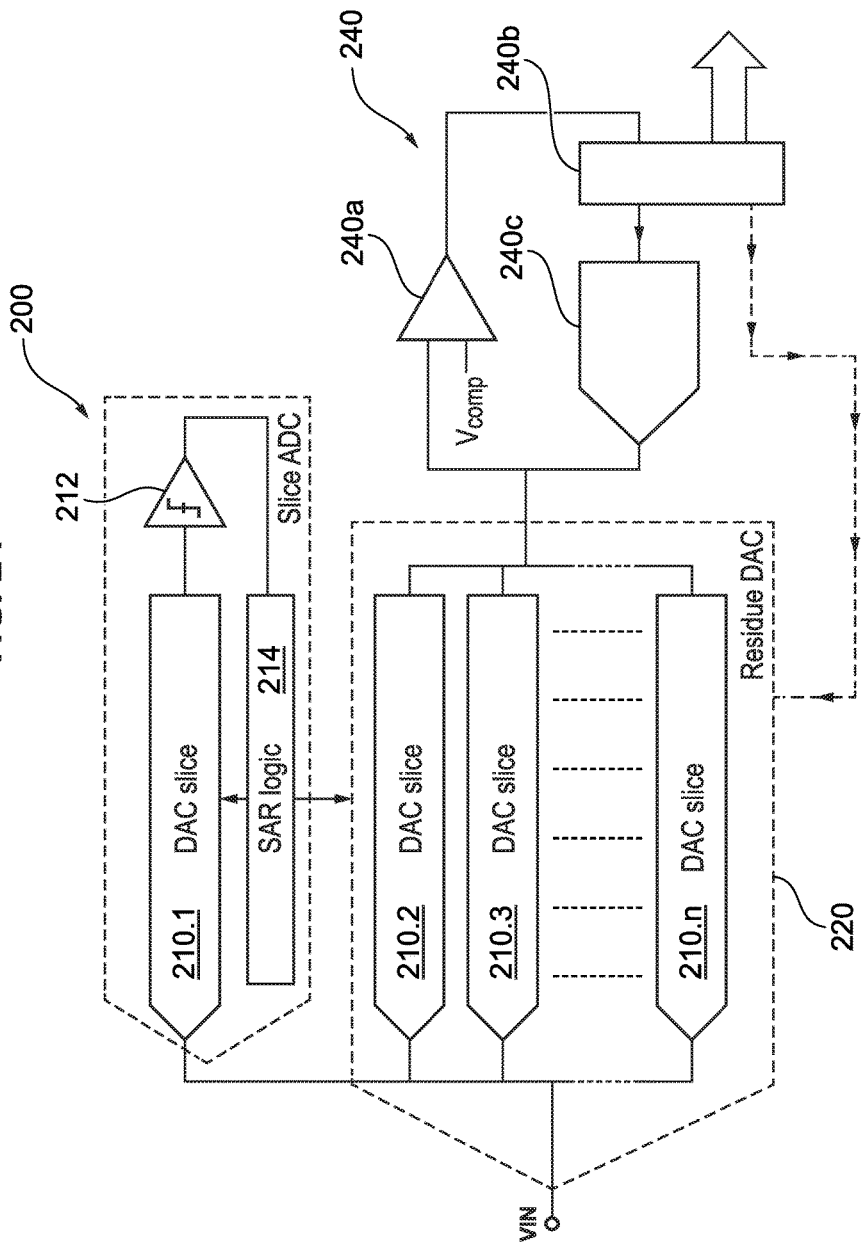
FIG. 24 shows a further variation of an ADC residue forming section constituting an embodiment of the present disclosure.

FIG. 24 shows a modification that can be applied to any of the arrangements described herein where the second ADC 240 can be allowed to modify the switch positions within the residue DAC 220. This may enable the ADC 240 to modify the residue (and the digital word from the first ADC 200) if the residue is inconveniently too large for the residue amplifier or for the comparator in the second ADC to handle without compromising their linearity. In this example the second ADC 240 is implemented as a SAR ADC comprising a comparator 240a, a SAR controller 240b and a DAC 240c. Similarly the switch positions can be modified as part of a SAR trial.

Figure 25:
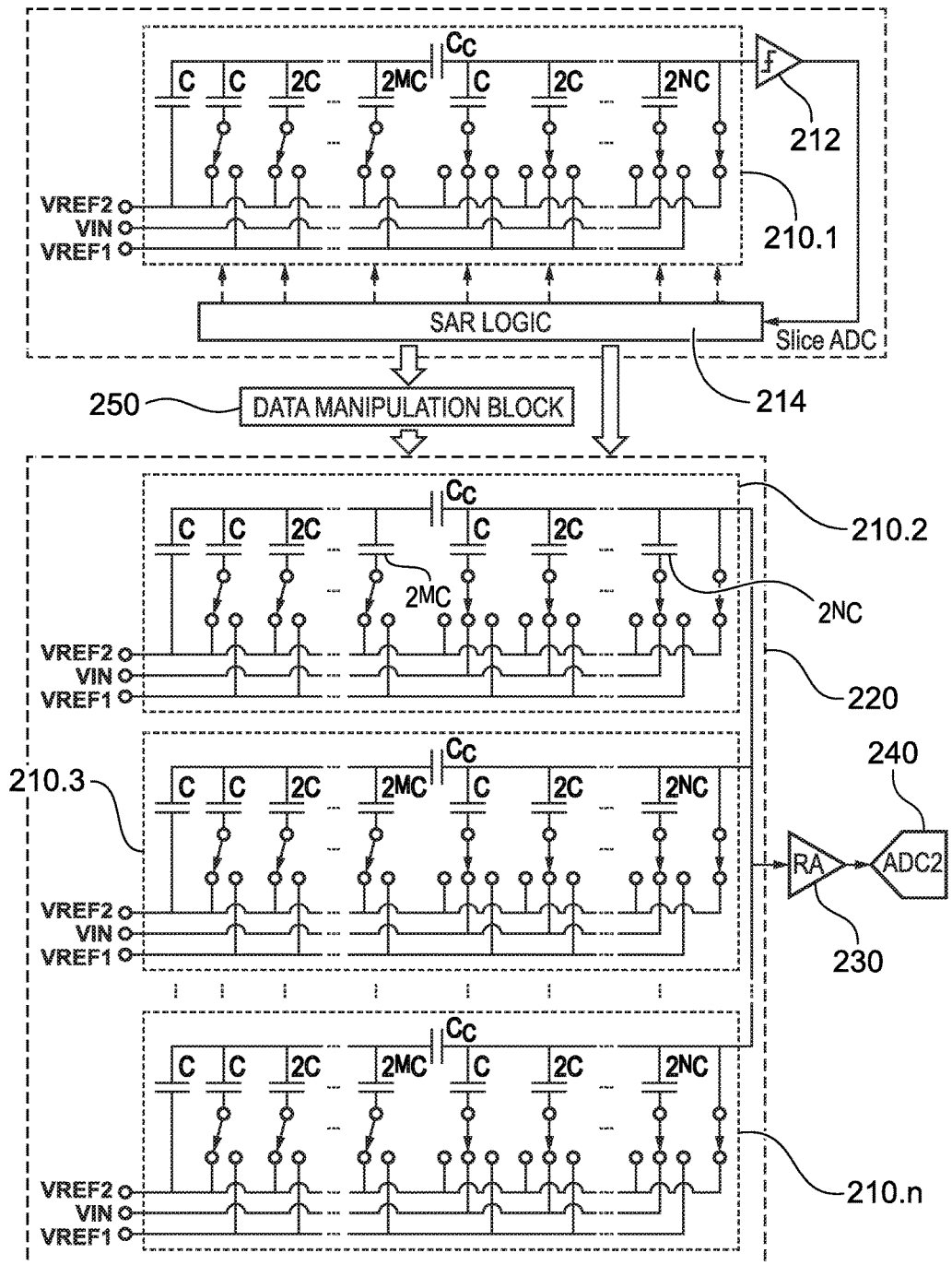
FIG. 25 shows the internal configuration of an embodiment of this disclosure in greater detail.

FIG. 25 schematically shows the circuit arrangement of FIG. 9 in greater detail. In this example each of the slices 210.1 to 210.n comprise a segmented capacitor array forming a sampling DAC together with a sub-DAC. The sampling DACs are identical or rather those portions of the first sub-array which are involved in sampling are identical. Furthermore, in this configuration shown in FIG. 25, the sub-DACs are also identical. However this need not be the case. The sub-DACs could be formed with lower resolution if desired. Suppose, for example, that the DAC slice 210.1 was an 8 bit slice, comprising 5 bits (N=5) in its main DAC and 3 bits (M=3) in its sub-DAC if 8 DAC slices 210.2 to 210.9 are provided in the residue DAC 220 then these 8 residue DACs effectively could be driven with different data words, as noted earlier, to provide a further 3 bits of resolution, within the sub or main DAC bringing the residue DAC back up to an 8 bit device. Thus the sub-DACs of the slices 210.2 to 210.n can be shortened or omitted if desired. Alternatively, if the slices are all the same as shown in FIG. 25, then the residue DAC can be driven to apply sub-LSB dither to its output signal for supply to the next stage in the pipelined analog to digital converter. These approaches can be adopted together.

In the arrangement shown in FIG. 25 a data manipulation block 250 is provided between the SAR logic 214 and each of the slices 210.2 to 210.n in the residue DAC 220. The data manipulation block allows the data word to each of the DAC slices 210.2 to 210.n to be individually set. Thus deliberately selecting different words provide for enhanced resolution or the incorporation of dither, or shuffling as described hereinbefore. The data manipulation block performs at least the operations of the data word generator 305.

Figure 26:
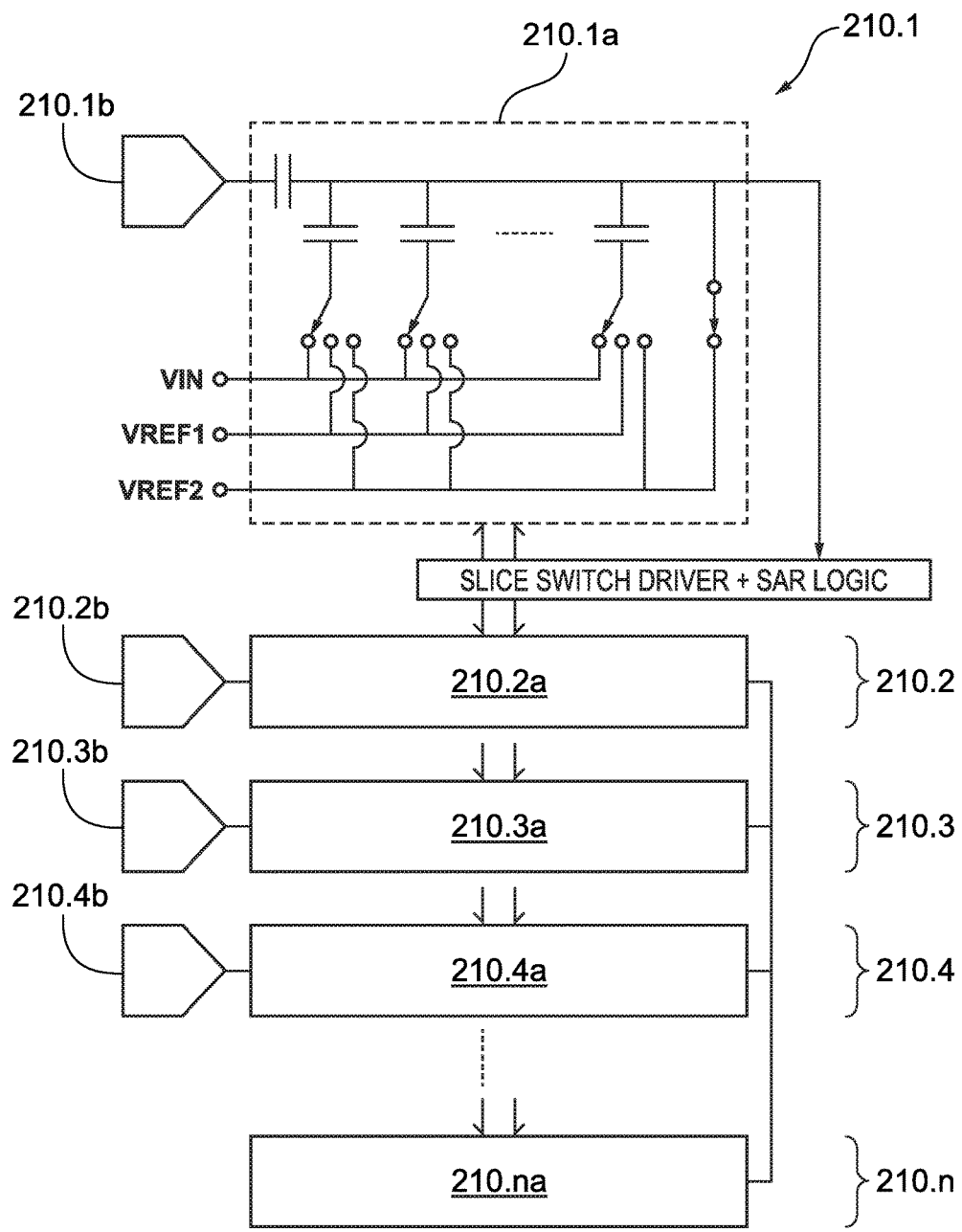
FIG. 26 is a generalized representation of a sliced architecture DAC operable to from an analog residue as part of a pipelined analog to digital converter and constituting an embodiment of this disclosure.

FIG. 26 is a generic representation of the sliced architecture where each slice 210.1 to 210.n is divided into a sampling DAC portion 210.1a, 210.2a, and so on up to 210.na and a sub-DAC 210.1b, 210.2b, 210.3b, and so on.

The slice sampling DACs 210.2a to 210.na are identical to each other. The sampling DAC 210.1a may or may not be the same as the sampling DACs 210.2a to 210.na, but advantageously has very similar electrical properties. This is best achieved by forming it of the same unit cell construction as the other slices. The non-sampling DACs need not be the same. The sub-DAC 210.1b may be formed, for example, with more bits than the other sub-DACs. Indeed not all of the slices need to be provided with a sub-DAC. Here the sub-DAC associated with sampling DAC 210.na has been omitted.

It was noted earlier in this disclosure that the current flow between the capacitors along the bond wires can perturb the voltage reference. Indeed, in the arrangement shown in FIG. 1 the voltage reference was buffered by a buffer amplifier in order to reduce the perturbation applied to it. The arrangement described herein has the advantage of reducing the perturbation of the voltage reference during the bit trial sequence and also gives the potential for the DAC slices 210.2 to 210.n in the residue DAC to be provided with a buffered version of the reference voltages which may be provided by way of a further buffer such that the reference voltage provided to the first slice 210.1 does not suffer perturbation due to switching of the capacitors in the slices 210.2 to 210.n to set up the residue DAC. It can be seen that if the capacitance of the capacitor array is effectively reduced from 40 pF to 4 pF then the current drawn from the reference is correspondingly reduced. Thus the energy required for conversion is reduced.

If, for example, the sampling DACs 210.1 to 210.n were all built the same, and the residue DAC has 8 slices summing to 40 pF (for noise purposes) then each slice would have a capacitance of 5 pF. This 5 pF is split up between, say, 31 unit cells in a 5 bit example or 63 unit cells in a 6 bit example of a sampling DAC array. This gives a unit capacitor size of 161 fF in the 5 bit case or 79 fF in the 6 bit case. It can be seen that this approach allows the sliced ADC to achieve a high bandwidth as the RC value of each unit cell is very small even with a modest series resistance to swamp any transistor to transistor variation. Also as only one of the slices performs the bit trials the currents drawn from the current source are much reduced. This reduction of charge required to perform the bit trials also means that some resistance can be deliberately introduced into the charge path to reduce ringing within the supply voltage to the capacitors of the DAC.

Figure 27:
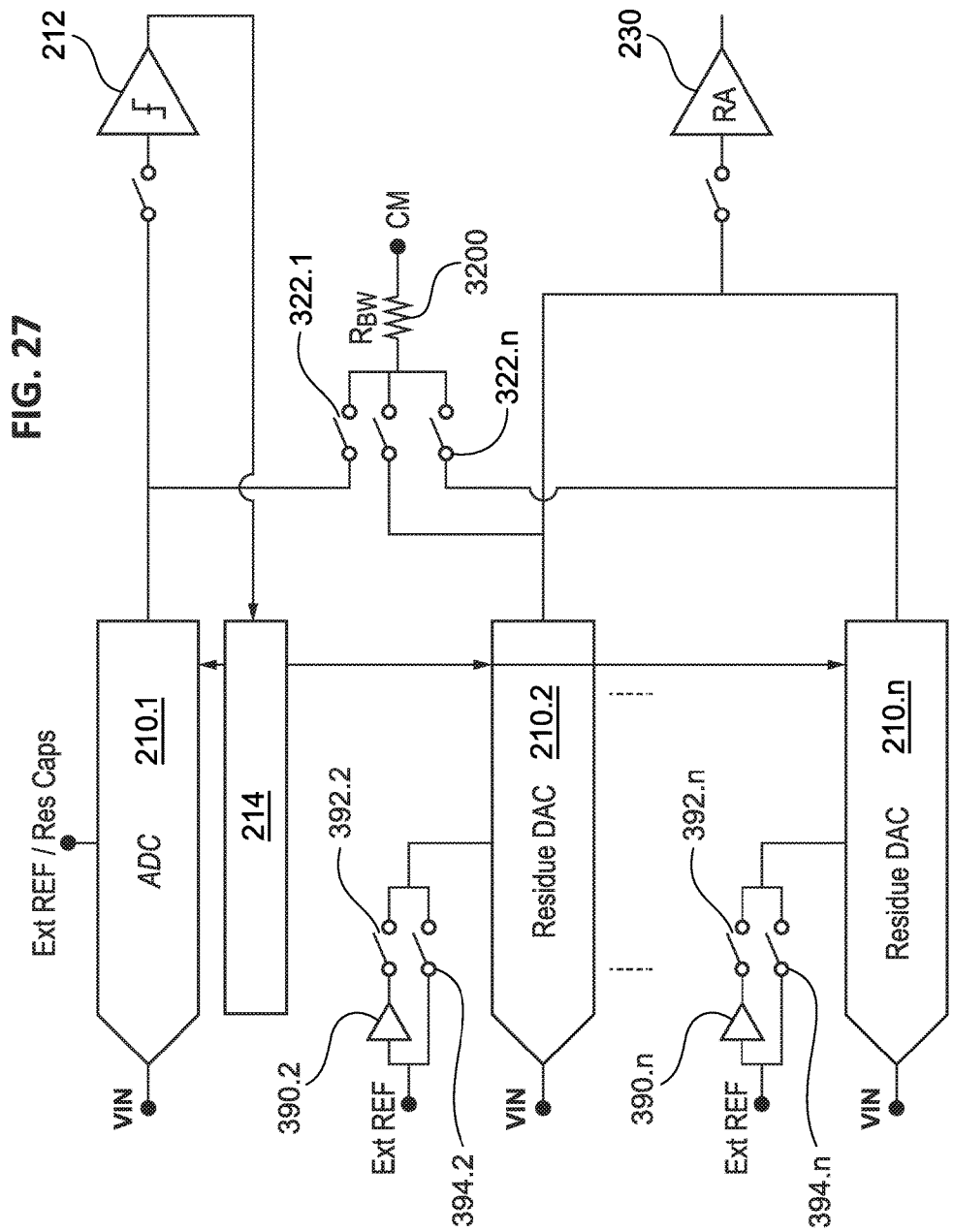
FIG. 27 shows an embodiment with a modified connection to an external reference.

FIG. 27 shows an arrangement where each of the slices 210.2 to 210.n of the residue DAC is connected to the external reference by way of a respective buffer 390.2 to 390.n which is selectively disconnectable from the slice 210.2 to 210.n by series switches 392.2 to 392.n and where the slice 201.2 to 210.n can also be directly connected to the external reference by way of a further switch 394.2 to 394.n. Consequently the residue DAC slices 210.2 to 210.n can each be charged by way of the buffer for the majority of the set up time thereby reducing the current drawn from the external reference, and be connected to the external reference towards the end of the settling time such that they settle towards a correct voltage unaffected by offsets within their respective buffers. Furthermore each of the switched capacitor arrays can have their bandwidths limited by selected connection to a signal/noise bandwidth limiting resistor 3200 by way of respective switches 322.1 to 322.n.

Figure 28:
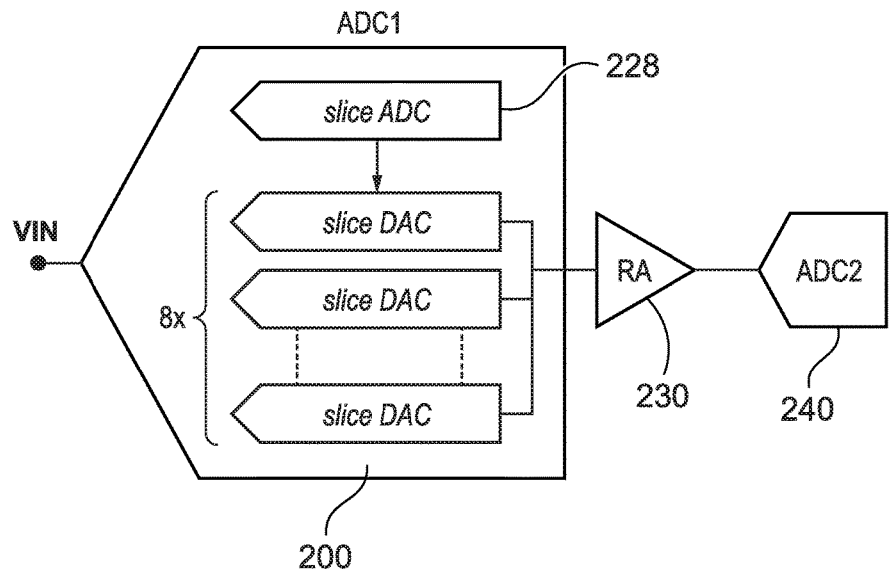
FIG. 28 shows a sliced ADC with eight sampling DAC slices.

For completeness, FIG. 28 schematically illustrates one embodiment of the present disclosure where a mini ADC 228, formed from one of the slices, works in association with eight other slices which form the residue DAC to drive the residue amplifier 230. In this embodiment the residue amplifier is connected to a further ADC 240. The first ADC, in this example, provides 6 or more bits of resolution while the second ADC 152 provides the remaining number of bits, for example 8 or more 9 bits of resolution to reach the desired overall resolution of the ADC.

In other examples each slice may present a capacitance of 3.2 pF, but the total digital to analog converter presented for the purposes of thermal noise amounts to 25.6 pF with the DACs operating in parallel.

It can be seen that the time to complete an SAR conversion can be expected to be longer than the time required to set up the individual DAC slices within the residue DAC. Furthermore, the output from the residue DAC is only really required after the SAR conversion from the first ADC is completed. This allows for the possibility of sharing a residue DAC between two or possibly more SAR slices. The SAR slices can be operated in a time interleaved manner such that one of them is about half way through its conversion when the other is sampling. Under such an arrangement the residue DAC has to sample at the same time as each of the SAR slices but immediately after it has finished sampling it can already be preset with at least half of the output word. The use of this approach is further enhanced by the use of an extra ADC, such as a Flash ADC in order to get the first few bits of the bit trial performed rapidly or to reduce the signal swing during trials.

Figure 29:
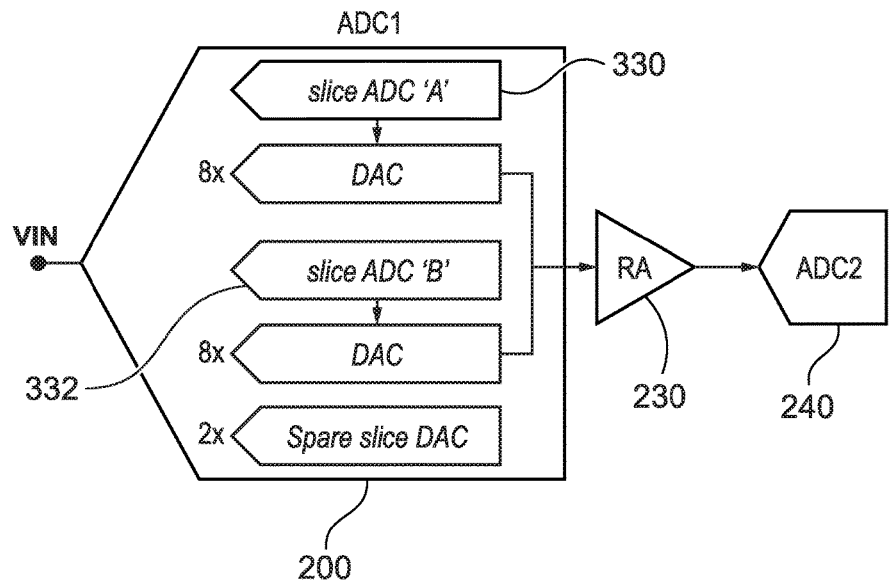
FIG. 29 shows a sliced ADC operable in a swapping or time interleaved manner.

FIG. 29 schematically illustrates an alternative embodiment of a pipelined architecture where two fast ADCs 330 and 332 are provided within ADC1 200, and each of the fast ADCs is associated with 8 DAC slices. The first ADC 200 is operated in a ping-pong time interleaved manner and hence exceptionally minor mismatches might still result in the generation of additional sampling tones. In order to mitigate this one or more slices can be shuffled amongst the slices of each one of the residue DACs in order to reduce the risk of tones.

Figure 30:
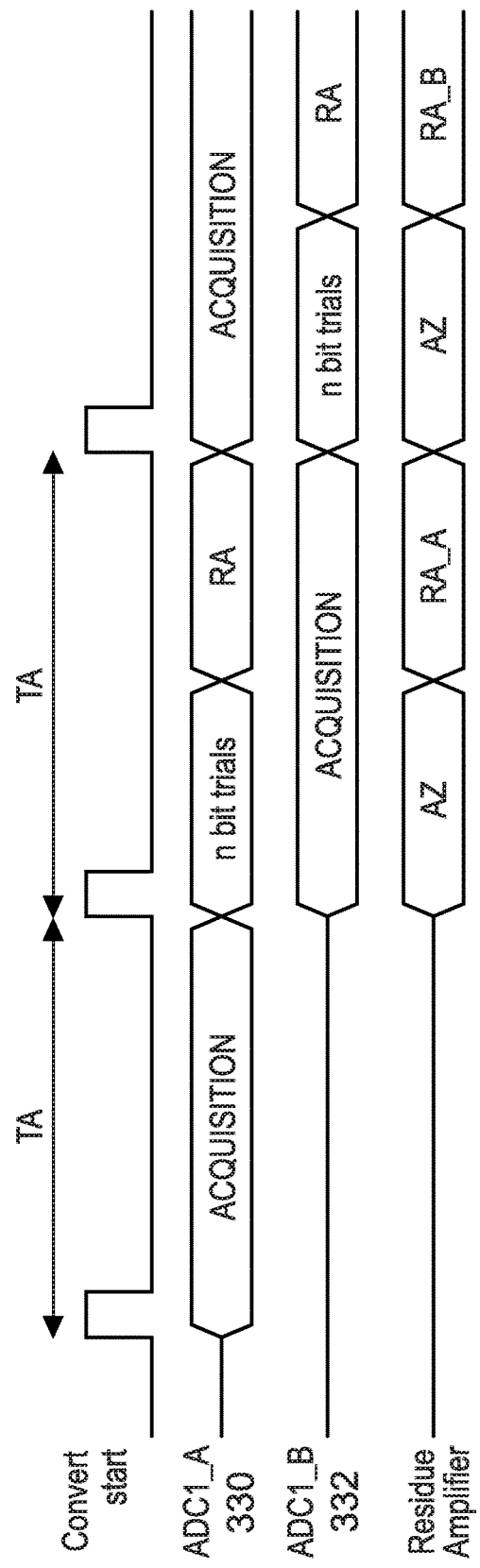
FIG. 30 is a timing diagram for the ADC shown in FIG. 29.

FIG. 30 schematically shows a timing diagram for the arrangement in FIG. 29. As it can be seen each of the first ADCs designated "A" and "B" in FIGS. 29 and 30 operates out of phase with the other such that when ADC "A" 330 is performing its acquisition in a time period $T_A$ between successive "convert start" signals, the ADC "B" undertakes its bit trials and then passes its result to the residue amplifier. In each period $T_A$ the residue amplifier spends approximately half of its time amplifying the residue from one of the residue DACs associated with the respective slice ADCs "A" and "B", and the other half of its time undergoing auto-zeroing, AZ, in order to remove offset errors therefrom.

Although the description has focused on the DAC slices being in the form of switched capacitor arrays which can act as host to the sampling capacitor and the digital to analog converter concurrently, the teachings of the present invention can also be applied to circuit arrangements where the sampling arrangement and the DAC are separated.

The number of stages in the pipeline can vary between two and the resolution of the converter. Put another way, each stage in the pipeline could be arranged to convert only one bit. The teachings of this disclosure would still be applicable to such a deeply pipelined arrangement as the time constant of each stage would be reduced by the multiple slices of a given stage which will act in parallel to provide the required noise performance. Thus the present disclosure is highly flexible and can be used in a vast number of configurations where DACs are required to interact with capacitor based sampling circuits.

The interleaving ratio can be 2× or more.

Figure 31:
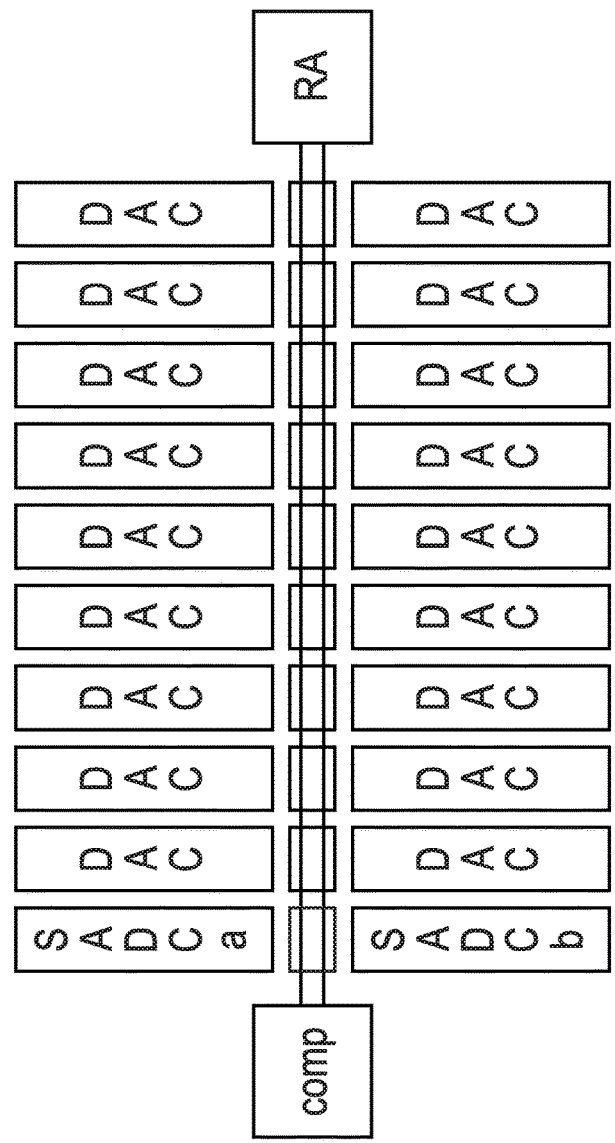
FIG. 31 is a layout diagram for an embodiment of the present disclosure.

FIG. 31 schematically illustrates an embodiment of a layout floorplan of the circuit shown in FIG. 29. The DAC slices are arranged in parallel between the comparator, "comp", associated with the slice ADC, and the residue amplifier, "RA", associated with this stage. One of the slices within each bank of switched capacitor DACs has, in this example, been allocated the role of being the slice ADC, SADC.

Figure 32:
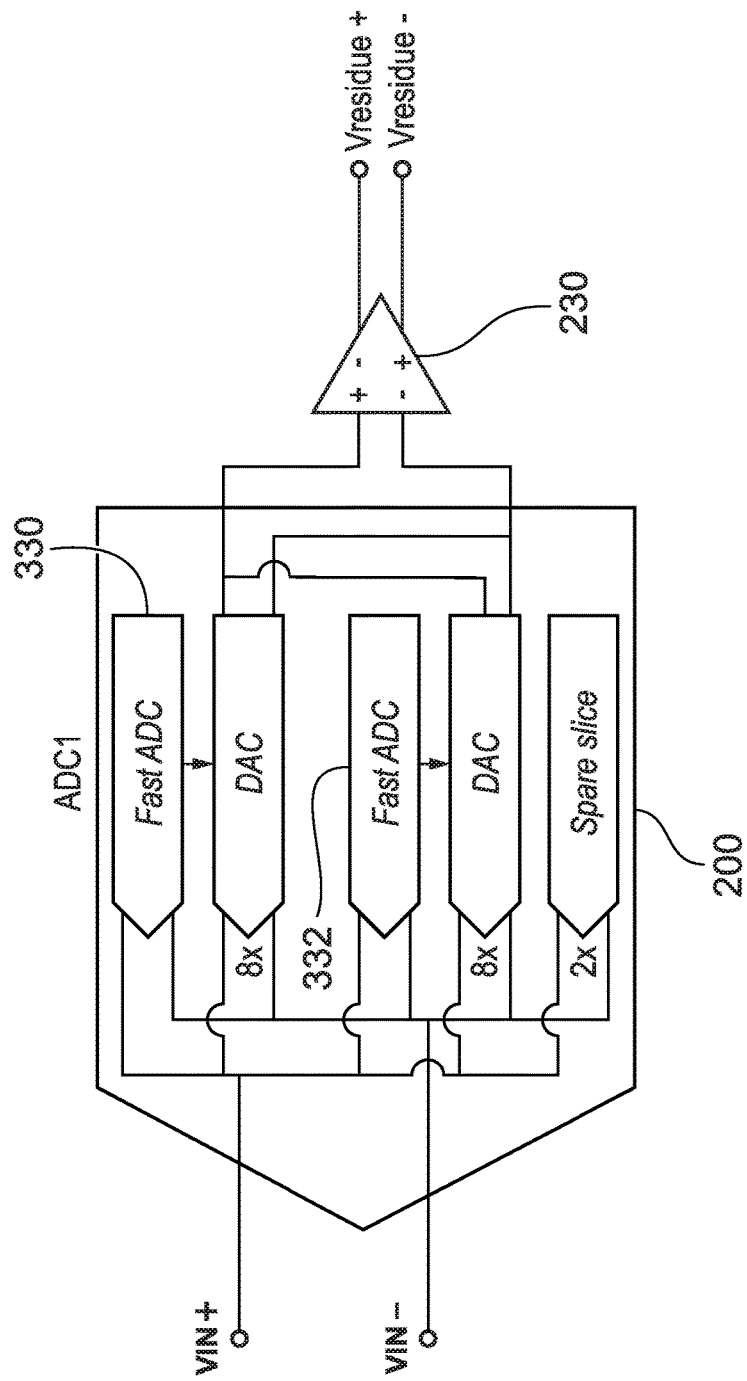
FIG. 32 is a schematic diagram of a differential ADC constituting an embodiment of the present disclosure.

As noted earlier, all of these circuits can be implemented within a differential ADC arrangement as shown in FIG. 32. Here capacitor arrays associated with the positive and negative inputs have each provide a residue signal to a differential residue amplifier 230.

It is thus possible to use a plurality of sampling DACs to work together to produce an improved ADC without sacrificing noise performance.

In the discussion so far, each cell has been a switched capacitor cell such that a sampling DAC can be used to improve performance within the contact of an ADC. However the DAC does not need to be a sampling DAC.

The cells could be cells for other DAC technologies, such as current sources in a current DAC where the current DAC is segmented or any other suitable technology.

The claims have been presented in single dependency format, however it is to be understood that for the purposes of those jurisdictions that allow multiply dependent claiming, each claim can depend on any preceding claim of the same type, unless that is clearly technically infeasible.

The present disclosure encompasses apparatuses which can perform the various methods described herein. Such apparatuses can include circuitry illustrated by the Figures and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on one or more non-transitory computer media.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the Figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the Figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the Figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

EXAMPLES

The examples have been presented to refer to a single example, however it is to be understood that the examples can incorporate one or more other examples of the same type (referencing the other example(s) together or in the alternative), unless that is clearly technically infeasible.

Example M1 is a method of improving linearity in a DAC or in an ADC including a DAC, wherein the DAC comprises a plurality of cooperating DACs, each cooperating DAC being divided into a main DAC and a sub-DAC, the method comprising: shuffling values for a plurality of bits of the main DACs in a shared shuffle pattern across each of the slices, and shuffling values related to some of the bits in the sub-DACs across the main DACs.

In Example M2, a method in Example M1 can further include in which a first shuffling process is cascaded with a second shuffling process, and of the first and second shuffling processes controls the shuffling in the shared shuffle pattern.

In Example M3, a method in Example M1 can further comprise connecting analog outputs of the slices to a shared output node to output an analog value.

In Example M4, a method in Example M1, can further include in which the conversion elements within one of the cooperating DACs are numbered by a first index and the cooperating DACs are numbered by a second index, and wherein a digital word to be converted comprises a first part and a second part, the method comprising forming respective data words for the plurality of cooperating DACs, each one of the respecting data words comprising a shared portion that is common to all of the cooperating DACs and an additional portion, where the additional portion encodes values from the second part of the digital word.

In Example M5, a method in Example M1, can further include where the cooperating DACs are sampling DACs operated to perform simultaneous sampling of a shared input signal.

In Example M6, a method in Example M1, can further include where the data values belong to the first portion are shuffled within the first index, and data values belonging to the second portion are shifted along the second index.

Example 1 is a residue forming sampling digital to analog converter, the digital to analog converter being responsive to a digital word which comprises a first part (B0-B4) and a second part (B5-B7), wherein the digital to analog converter comprises a plurality of cooperating digital to analog converters (DS1-DS8, 210.2-210.n) arranged in parallel, and wherein the cooperating digital to analog converters (DS1-DS8) receive respective data words from a data word generator (305), the data words comprising a shared portion (312), the shared portion representing the first part of the digital word following shuffling by the data word generator, and an additional portion (314), where the additional portion encodes values belonging to the second part of the digital word In Example 2, the digital to analog converter in Example 1 can further include, in which the data word generator comprises at least two shufflers (350, 352), a first shuffler arranged to receive the first part of the data word and to generate shared shuffled data signals to a first group of conversion elements of the cooperating digital to analog converters, and a second shuffler arranged to receive at least part of the second part of the digital word and to generate shuffled data signals relating to bits not belonging to the first part of the digital word, said data signals also being used to control the first group of conversion elements.

In Example 3, the digital to analog converter in Example 1 can further include, wherein the data word generator comprises cascaded shufflers (300, 302), a first shuffler (300) receiving a plurality of bits for controlling a first group of conversion elements and a second shuffler (302) receiving bits for controlling some of the second group of conversion elements, the second shuffler also receiving the least significant bit (B4) of the first group of conversion elements.

In Example 4, the digital to analog converter in Example 3 can further include, in which the second shuffler (302) also receives data signals from the first shuffler (300).

In Example 5, the digital to analog converter in Example 5 can further include, in which the second shuffler (350) supplies an input to the first shuffler.

In Example 6, the digital to analog converter in Example 6 can further include, in which the at least one element of the first group of elements in each cooperating digital to analog converter which is controlled based on a bit value associated with the second group of elements is shuffled into different conversion elements in the plurality of the cooperating digital to analog converters for each operation of the cooperating digital to analog converters.

In Example 7, the digital to analog converter in Example 1 can further include, in which the input to the data word generator further includes at least one additional bit signal for injecting a known signal into the plurality of cooperating digital to analog converters for use in one or more of: a dithering of the output, and a calibration procedure.

In Example 8, the digital to analog converter in Example 1 can further include, wherein the plurality of cooperating digital to analog converters comprise a plurality of slices (210.2-210.n), each slice comprising a plurality of conversion elements (C0-C9), the elements being sub-divided into a first group of conversion elements (C0-C4, S4) and a second group of conversion elements (C5-C9), the first and second groups of conversion elements being connected together by an intermediate component, and where at least one of the elements (S4) of the first group of conversion elements in each slice is controlled in response to a bit value based on data words whose weight is appropriate for the second group of conversion elements of at least some of the plurality of slices.

In Example 9, the digital to analog converter in Example 8, can further include, in which the first group of elements is operable to digitize a word to a least significant bit resolution (B4) of the first group and the at least one of the elements (S4) that is controlled in response to a bit value based on the data words of the second group of elements and has a size equal to the least significant bit (B4).

In Example 10, the digital to analog converter in Example 2, can further include, in which bit values (B0-B4) representing a binary encoded value for the first group of conversion elements (C0-C4) are converted by the data generator to thermometer or unary encoded form and shuffled into element control signals for a plurality of conversion elements of the first group and the elements are selected on a shuffled or randomized basis in each first group of elements within each slice.

In Example 11, the digital to analog converter in Example 1, can further include, in which with the exception of the at least one element of the first group of conversion elements each cooperating digital to analog receives the same shuffled data word for the conversion elements therein.

In Example 12, the digital to analog converter in Example 1, can further include, in which the cooperating digital to analog converters are formed of switched capacitors.

In Example 13, the digital to analog converter in Example 1, can further include, in which the digital to analog converter is a residue forming stage of an analog to digital converter.

In Example 14, the digital to analog converter in Example 1, can further include, where each of the cooperating digital to analog converters (210.2-210.n) includes a main digital to analog converter part (210.2a-210.na) and at least some of the cooperating digital to analog converters include a sub-digital to analog converter part (210.2b-210.4b), where the main digital to analog converter part (210.2a-210.na) converts the first part of the digital word, the first part representing a more significant part of the digital word, and the sub-digital to analog converter converts bits of lesser significance of the digital word.

In Example 15, the digital to analog converter in Example 1, can further include, in which the plurality of cooperating digital to analog converters comprise K converters selected from a bank of L converters, where K and L are integers and L is greater than K, the selection of the K converters being dynamically chosen.

Example 16 is a digital to analog converter comprising a plurality of DAC slices, each slice being segmented into a main DAC part and a sub-DAC part, the main DAC part outputting an analog value relating to a plurality of most significant bits of a data word, and the sub-DAC part outputting a value associated with a plurality of bits of lesser significant, wherein some of the bit values associated with the sub-DAC are shuffled across the main DAC part of the DAC slices.

In Example 17, the digital to analog converter in Example 16 can further include, in which the digital to analog converter is a sampling capacitor charge-sharing digital to analog converter.

In Example 18, the digital to analog converter in Example 16 can further include, in which the main DAC portions of each slice are nominally identical in terms of capacitance or nominally identical in terms of sampling time constant when in a sampling mode.

Example 19 is analog to digital converter including a digital to analog converter of any one of the Examples 1-18.

In Example 20, the digital to analog converter in Example 1 can further include wherein the position of the additional portion is shuffled within the cooperating digital to analog converters.

In Example 21, the analog to digital converter in Example 20 can further comprising two residue forming digital to analog converters of any one of the Examples 1-18, arranged in parallel and operated in a time interleaved manner.

Example 22 is a digital to analog converter for converting a digital word to an analog value, where the digital word comprises a first part and a second part, and the digital to analog converter comprises a plurality of nominally matched cells, each response to a cell data word to switch the cell to one of a first value and a second value, and wherein a data word generator is responsive to the digital word and generates cell data signals to cause a cell to select either the first value or the second value, and wherein the cells are addressed by a two dimensional address having a first index and a second index, and the data word generator performs a shuffling operation on the first part of the digital word by shuffling the first part within the first index.

What is claimed is:

1. A residue-forming sampling digital to analog converter, the residue-forming sampling digital to analog converter being responsive to a digital word which comprises a first part and a second part, wherein the residue-forming sampling digital to analog converter comprises:
    a plurality of cooperating digital to analog converters arranged in parallel, wherein:
        the plurality of cooperating digital to analog converters receive respective data words from a data word generator,
        the data words comprise a shared portion and an additional portion;
        the shared portion represents the first part of the digital word following shuffling by the data word generator, and
        the additional portion encodes values belonging to the second part of the digital word.

2. The residue-forming sampling digital to analog converter of claim 1, wherein:
    the data word generator comprises at least two shufflers, and
    the at least two shufflers comprise:
        a first shuffler arranged to receive the first part of the digital word and to generate shared shuffled data signals to a first group of conversion elements of the cooperating digital to analog converters, and
        a second shuffler arranged to receive at least part of the second part of the digital word and to generate shuffled data signals relating to bits not belonging to the first part of the digital word,
        wherein the shuffled data signals are used to control the first group of conversion elements.

3. The residue-forming sampling digital to analog converter of claim 1, wherein:
    the data word generator comprises cascaded shufflers, and
    the cascaded shufflers comprise:
        a first shuffler to receive a plurality of bits for controlling a first group of conversion elements, and
        a second shuffler to receive bits for controlling some of a second group of conversion elements, and to receive information from the first part of the digital word.

4. The residue-forming sampling digital to analog converter of claim 3, in which the second shuffler also receives data signals from the first shuffler.

5. The residue-forming sampling digital to analog converter of claim 4, in which the second shuffler supplies an input to the first shuffler.

6. The residue-forming sampling digital to analog converter of claim 5, wherein:
    at least one conversion element of the first group of conversion elements in each cooperating digital to analog converter, which is controlled based on a bit value associated with the second group of conversion elements, is shuffled into different conversion elements in the plurality of the cooperating digital to analog converters for each operation of the cooperating digital to analog converters.

7. The residue-forming sampling digital to analog converter of claim 1, wherein:
    an input to the data word generator further includes at least one additional bit signal for injecting a known signal into the plurality of cooperating digital to analog converters for use in one or more of: a dithering of an output, and a calibration procedure.

8. The residue-forming sampling digital to analog converter of claim 1, wherein:
    the plurality of cooperating digital to analog converters comprise a plurality of slices,
    each slice comprises a plurality of conversion elements,
    the conversion elements are sub-divided into a first group of conversion elements and a second group of conversion elements,
    the first and second groups of conversion elements are connected together by an intermediate component, and
    at least one conversion element of the first group of conversion elements in each slice is controlled in response to a bit value based on data words whose weight is appropriate for the second group of conversion elements in at least some of the plurality of slices.

9. The residue-forming sampling digital to analog converter of claim 8, wherein:
    the first group of conversion elements is operable to digitize a word to a least significant bit resolution of the first group of conversion elements, and at least one conversion element of the first group of conversion elements is controlled in response to a bit value based on the data words of the second group of conversion elements and has a size equal to a least significant bit.

10. The residue-forming sampling digital to analog converter of claim 2, wherein:
   bit values representing a binary encoded value for the first group of conversion elements are converted by the data word generator to thermometer or unary encoded form and shuffled into element control signals for a plurality of conversion elements of the first group of conversion elements, and
   the conversion elements of the first group of conversion elements are selected on a shuffled or randomized basis within each slice.

11. The residue-forming sampling digital to analog converter of claim 2, wherein:
   with an exception of at least one element of the first group of conversion elements, each cooperating digital to analog converter receives the same shuffled data word for the conversion elements therein.

12. The residue-forming sampling digital to analog converter of in claim 1, wherein:
   the cooperating digital to analog converters are formed of switched capacitors.

13. The residue-forming sampling digital to analog converter of claim 1, wherein the residue-forming sampling digital to analog converter is a residue-forming stage of an analog to digital converter.

14. The residue-forming sampling digital to analog converter of claim 1, wherein:
   each cooperating digital to analog converter includes a main digital to analog converter part, and
   at least some of the cooperating digital to analog converters include a sub-digital to analog converter part, wherein the main digital to analog converter part converts the first part of the digital word, the first part representing a more significant part of the digital word, and the sub-digital to analog converter converts bits of lesser significance of the digital word.

15. The residue-forming sampling digital to analog converter of claim 1, wherein:
   the plurality of cooperating digital to analog converters comprise K converters selected from a bank of L converters,
   K and L are integers,
   L is greater than K, and
   a selection of the K converters is dynamically chosen.

16. The residue-forming sampling digital to analog converter of claim 1, wherein:
   a position of the additional portion is shuffled within the cooperating digital to analog converters.

17. A digital to analog converter comprising:
   a plurality of DAC slices, wherein:
      each slice is segmented into a main DAC part and a sub-DAC part,
      the main DAC part to output an analog value relating to a plurality of most significant bits of a digital word, and
      the sub-DAC part to output a value associated with a plurality of bits of lesser significance, wherein some of bit values associated with the sub-DAC part are shuffled across the main DAC part of the DAC slices.

18. The digital to analog converter of claim 17, wherein the digital to analog converter is a sampling capacitor charge-sharing digital to analog converter.

19. The digital to analog converter of claim 17, in which the main DAC parts of each slice are nominally identical in terms of capacitance or nominally identical in terms of sampling time constant when in a sampling mode.

20. A digital to analog converter for converting a digital word to an analog value, wherein:
   the digital word comprises a first part and a second part, and
   the digital to analog converter comprises a plurality of nominally matched cells;
   wherein:
      each nominally matched cell responds to a cell data word to switch the nominally matched cell to one of a first value and a second value,
      a data word generator is responsive to the digital word and generates cell data signals to cause a cell to select either the first value or the second value,
      the cells are addressed by a two dimensional address having a first index and a second index, and
      the data word generator performs a shuffling operation on the first part of the digital word by shuffling the first part within the first index.

* * * * *